United States Patent
Lilak et al.

(10) Patent No.: US 11,011,537 B2
(45) Date of Patent: May 18, 2021

(54) VERTICAL INTERCONNECT METHODS FOR STACKED DEVICE ARCHITECTURES USING DIRECT SELF ASSEMBLY WITH HIGH OPERATIONAL PARALLELIZATION AND IMPROVED SCALABILITY

(71) Applicant: Intel Corporation, Santa Clara, CA (US)

(72) Inventors: Aaron D. Lilak, Beaverton, OR (US); Patrick Theofanis, Portland, OR (US); Patrick Morrow, Portland, OR (US); Rishabh Mehandru, Portland, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 16/324,479

(22) PCT Filed: Sep. 30, 2016

(86) PCT No.: PCT/US2016/055012
§ 371 (c)(1),
(2) Date: Feb. 8, 2019

(87) PCT Pub. No.: WO2018/063396
PCT Pub. Date: Apr. 5, 2018

(65) Prior Publication Data
US 2019/0221577 A1   Jul. 18, 2019

(51) Int. Cl.
*H01L 27/11582* (2017.01)
*H01L 27/11575* (2017.01)
*H01L 27/1157* (2017.01)

(52) U.S. Cl.
CPC .... *H01L 27/11582* (2013.01); *H01L 27/1157* (2013.01); *H01L 27/11575* (2013.01)

(58) Field of Classification Search
CPC ......... H01L 27/11582; H01L 27/11575; H01L 27/1157
See application file for complete search history.

(56) References Cited

U.S. PATENT DOCUMENTS

| 4,857,479 A | * | 8/1989 | McLaughlin | ..... H01L 21/28531 438/348 |
| 5,010,386 A | * | 4/1991 | Groover, III | .......... H01L 27/092 257/328 |

(Continued)

FOREIGN PATENT DOCUMENTS

| TW | 275137 | 5/1996 |
| TW | 201606388 | 2/2016 |

OTHER PUBLICATIONS

International Preliminary Report on Patentability for International Patent Application No. PCT/US2016/055012 dated Apr. 11, 2019, 9 pgs.

(Continued)

*Primary Examiner* — Errol V Fernandes
*Assistant Examiner* — Jeremy J Joy
(74) *Attorney, Agent, or Firm* — Schwabe, Williamson & Wyatt P.C.

(57) ABSTRACT

An apparatus including an array of at least two vertically stacked layers of integrated circuit device components separated by a dielectric layer on a substrate, wherein each of the at least two vertically stacked layers includes a laterally disposed contact point; and an electrically conductive interconnection coupled to a lateral edge of the contact point of each of the at least two vertically stacked layers and bridging the dielectric layer. A method including forming an array of at least two vertically stacked layers of integrated circuit device components separated by a dielectric layer on a substrate, forming a trench that exposes a lateral contact point of each of the at least two vertically stacked layers;

(Continued)

depositing a polymer in the trench, wherein the polymer preferentially aligns to a material of the lateral contact point and bridges the dielectric layer; and modifying or replacing the polymer with an electrically conductive material.

23 Claims, 21 Drawing Sheets

(56) References Cited

U.S. PATENT DOCUMENTS

| | | | | |
|---|---|---|---|---|
| 5,439,848 | A * | 8/1995 | Hsu | H01L 23/5283 |
| | | | | 257/E21.575 |
| 6,839,263 | B2 | 1/2005 | Fricke et al. | |
| 6,903,367 | B2 * | 6/2005 | Forbes | H01L 29/7881 |
| | | | | 257/302 |
| 6,964,896 | B2 * | 11/2005 | Gonzalez | H01L 21/28512 |
| | | | | 257/316 |
| 2006/0234487 | A1 * | 10/2006 | Kim | H01L 21/76898 |
| | | | | 438/597 |
| 2006/0246709 | A1 | 11/2006 | Kim et al. | |
| 2006/0246710 | A1 * | 11/2006 | Cheong | H01L 21/76846 |
| | | | | 438/618 |
| 2007/0035033 | A1 * | 2/2007 | Ozguz | H01L 23/49827 |
| | | | | 257/777 |
| 2008/0185648 | A1 * | 8/2008 | Jeong | H01L 27/10802 |
| | | | | 257/347 |
| 2011/0300686 | A1 | 12/2011 | Chae et al. | |
| 2013/0153847 | A1 * | 6/2013 | Park | H01L 27/0688 |
| | | | | 257/2 |
| 2013/0241025 | A1 * | 9/2013 | Pagani | H05K 1/181 |
| | | | | 257/499 |
| 2013/0307160 | A1 | 11/2013 | Farooq et al. | |
| 2015/0115463 | A1 | 4/2015 | Pelley et al. | |
| 2015/0357284 | A1 * | 12/2015 | Sandhu | H01L 21/76816 |
| | | | | 257/774 |

OTHER PUBLICATIONS

International Search Report and Written Opinion for International Patent Application No. PCT/US2016/055012 dated Jun. 29, 2017, 12 pgs.

Office Action from Taiwan Patent Application No. 106126777 dated Dec. 3, 2020, 13 pgs.

Notice of Allowance from Taiwan Patent Application No. 106126777 dated Mar. 16, 2021, 3 pgs.

* cited by examiner

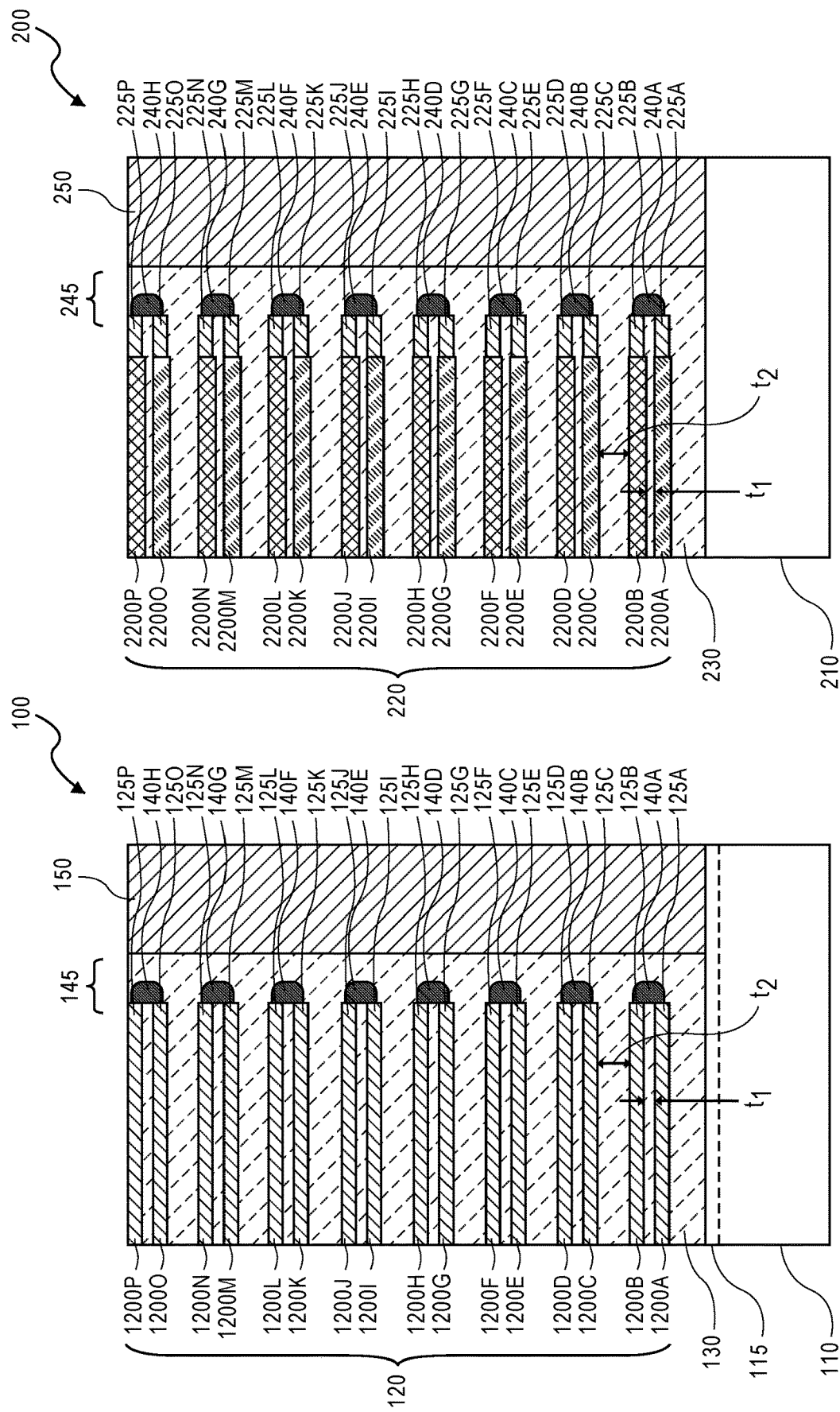

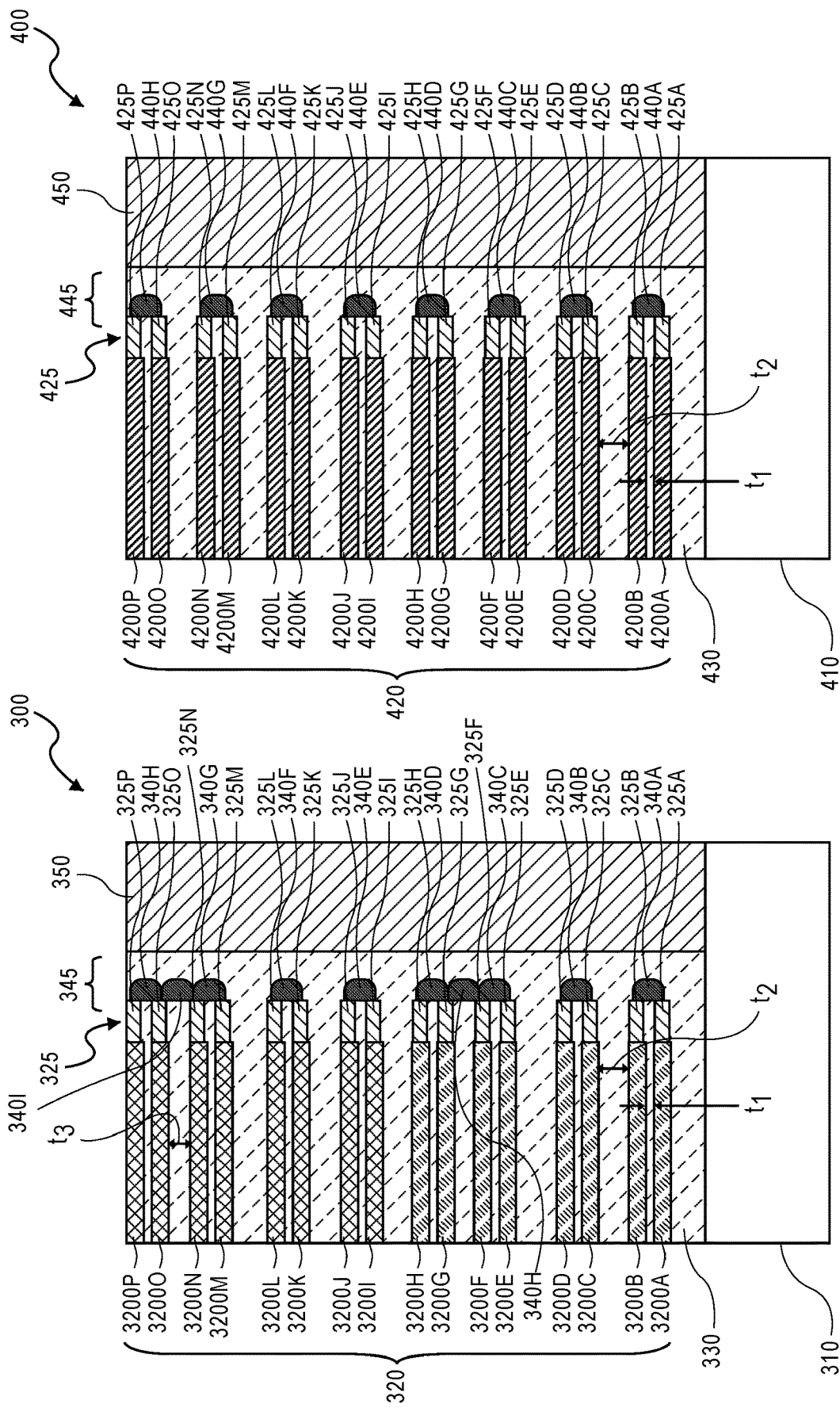

VERTICAL INTERCONNECT METHODS FOR STACKED DEVICE ARCHITECTURES USING DIRECT SELF ASSEMBLY WITH HIGH OPERATIONAL PARALLELIZATION AND IMPROVED SCALABILITY

CROSS-REFERENCE TO RELATED APPLICATION

This patent application is a U.S. National Phase application under 35 U.S.C. § 371 of International Application No. PCT/US2016/055012, filed Sep. 30, 2016, entitled "VERTICAL INTERCONNECT METHODS FOR STACKED DEVICE ARCHITECTURES USING DIRECT SELF ASSEMBLY WITH HIGH OPERATIONAL PARALLELIZATION AND IMPROVED SCALABILITY," which designates the United States of America, the entire disclosure of which is hereby incorporated by reference in its entirety and for all purposes.

BACKGROUND

Field

Integrated circuit processing.

Description of Related Art

Three-dimensional (3D) integrated circuit device structures are structures including components stacked vertically on a substrate in multiple layers as an array. 3D memory structures (3D NAND) are commercially available. The vertical stacking of components, such as memory cells, allows an increase in the density of components on a particular chip and therefore offers the potential for higher capacity in a smaller physical space than two-dimensional (2D) arrangement. One way to interconnect 3D NAND is through the use of a "staircase etch" process that accesses cells in different layers in the stack. Interlayer interconnects are then formed between the cells by routing through lower metal layers and return via a similar staircase via. The process results in a generally higher complexity than 2D NAND. The staircase approach also consumes a significant area as the layers ascend and a significant spatial volume in the lower metal layers for interconnects.

BRIEF DESCRIPTION OF THE DRAWINGS

FIG. 1 shows a cross-sectional side view of one embodiment of a three-dimensional (3D) structure including an array of interconnects or metal lines as integrated circuit device components.

FIG. 2 shows a cross-sectional side view of another embodiment of the 3D integrated circuit structure including an array of transistor devices as integrated circuit device components.

FIG. 3 shows a cross-sectional side view of another embodiment of 3D integrated circuit structure including an array of transistor devices as integrated circuit device components.

FIG. 4 shows a cross-sectional side view of another embodiment of a 3D integrated circuit structure including an array of transistor devices as integrated circuit device components.

DETAILED DESCRIPTION

Figure 5:
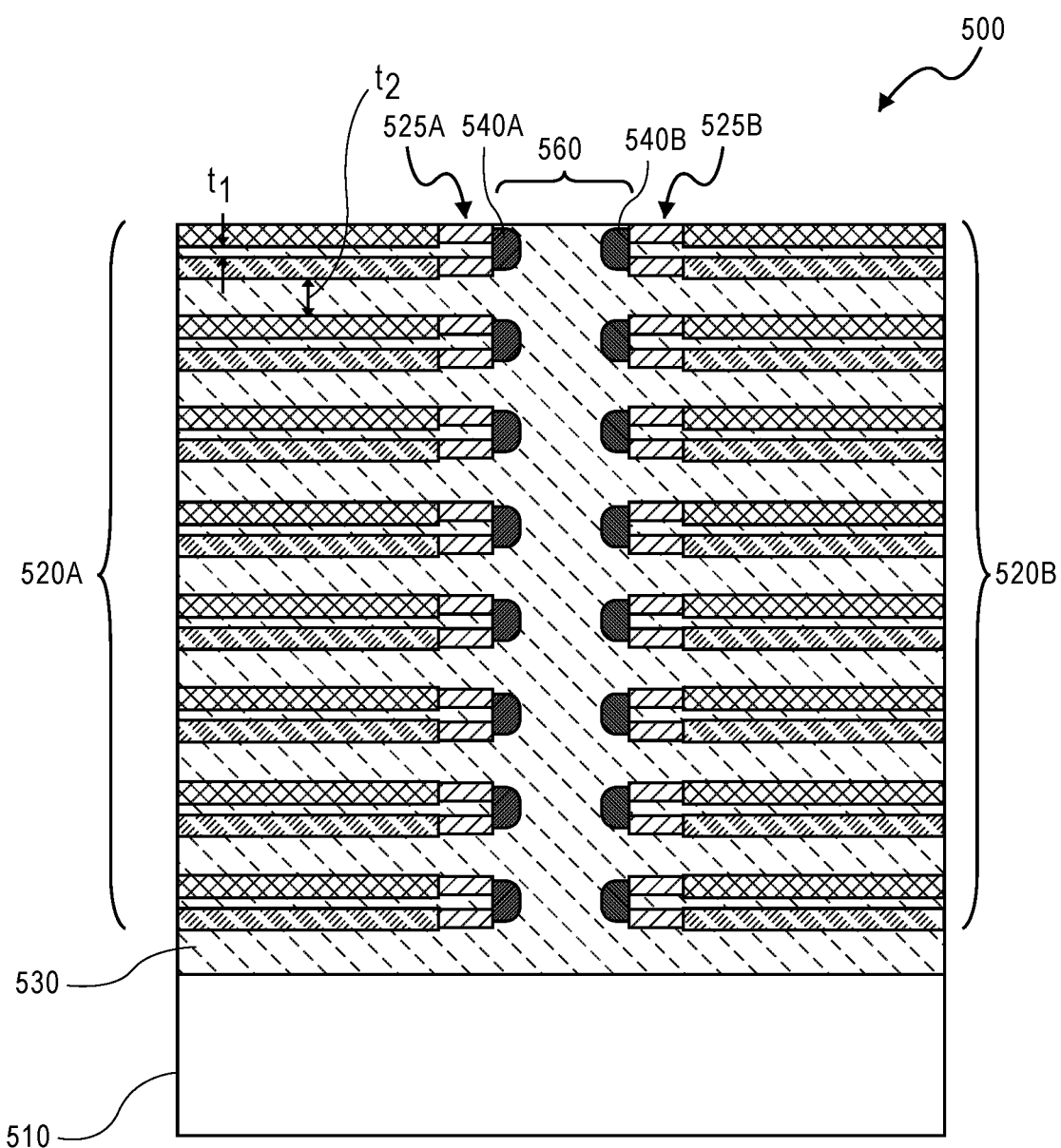
FIG. 5 shows a cross-sectional side view of another embodiment of an integrated circuit device structure including two vertically stacked arrays of integrated circuit device components with interconnections of device layers of the respective arrays formed on opposite sides of the two arrays.

An integrated circuit device structure is disclosed that includes an array of at least two vertically stacked layers of integrated circuit device components on a substrate such as a chip. Each of the vertically stacked layers includes a laterally disposed contact point that is connected to an electrically conductive interconnection. Such layers of integrated circuit device components include electrically conductive layers and layers of devices (e.g., a layer of CMOS devices, a layer of N-type transistor devices and a layer of P-type transistor devices, memory cells, logic circuits, etc.). The interconnection between contact points and vertically stacked layers are formed through the use of polymers that have specific characteristic lengths and adhesion properties that can be engineered for different structures as described herein to form a self-aligned contact structure. These polymers adhere in an ordered and characteristic manner and may be designed so as to utilize direct self-assembly (DSA) in the formation of interconnections in desired areas. Thus, methods of forming 3D integrated circuit devices are also described.

FIG. 1 shows a cross-sectional side view of one embodiment of a 3D integrated circuit structure. Referring to FIG. 1, structure 100 includes substrate 110 that is, for example, a semiconductor substrate such as bulk silicon or a silicon on insulator (SOI) substrate. Substrate 110, in one embodiment, is part of a larger substrate of other structures (e.g., other similar structures) such as a wafer. Disposed on or overlying substrate 110, in one embodiment, is optional device layer 115 of, for example, transistor devices that may be formed according to known processing techniques. Disposed on optional device layer 115 is array 120 of vertically stacked integrated circuit device components, in this example, interconnects of a conductive material such as copper (e.g., copper metal lines). Each interconnect has a laterally disposed contact point. FIG. 1 shows interconnect 1200A having contact point 125A; interconnect 1200B having contact point 125B; interconnect 1200C having contact point 125C; interconnect 1200D having contact point 125D; interconnect 1200E having contact point 125E; interconnect 1200F having contact point 125F; interconnect 1200G having contact point 125G; interconnect 1200H having contact point 125H; interconnect 1200I having contact point 125I; interconnect 1200J having contact point 125J; interconnect 1200K having contact point 125K; interconnect 1200L having contact point 125L; interconnect 1200M having contact point 125M; interconnect 1200N having contact point 125N; and interconnect 1200O having contact point 125O. Contact points 125A-125O are each disposed in contact area 145 of structure 100. Interconnects 1200A-1200P may be formed directly on substrate 110 by known processing techniques such as electroplating a copper metal line according to a pattern or transferred from another substrate.

In one embodiment, interconnects 1200A-1200P are connected in pairs at their respective contact points by a vertically disposed interconnection in contact area 145. FIG. 1 shows interconnect 1200A connected to interconnect 1200B by interconnection 140A; interconnect 1200C connected to interconnect 1200D by interconnection 140B; interconnect 1200E connected to interconnect 1200F by interconnection 140C; interconnect 1200G connected to interconnect 1200H by interconnection 140D; interconnect 1200I connected to interconnect 1200J by interconnection 140E; interconnect 1200K connected to interconnect 1200L by interconnection 140F; interconnect 1200M connected to interconnect 1200N by interconnection 140G; and interconnect 1200O connected to interconnect 1200P by interconnection 140H. Interconnections 140A-140H, in this embodiment, are an electrically conductive material and are aligned vertically as viewed, one over the other, in contact area 145 of the structure.

In structure 100 of FIG. 1, the connected pairs of interconnects are separated from one another and from other connected pairs by dielectric material 130 such as silicon dioxide or a dielectric material having a dielectric constant less than silicon dioxide (a low-k material), or another insulating material such as silicon nitride or silicon oxynitride. In one embodiment, a thickness of dielectric material 130 between two connected interconnects (e.g., interconnect 1200A and interconnect 1200B) has a thickness, $t_1$, that is selected to allow a bridging of a single block fraction of a block copolymer to align to contact points of each of a pair of interconnects. A thickness, $t_2$, of dielectric material 130 between adjacent pairs of interconnects (e.g., between interconnects 1200A/1200B and interconnects 1200C/1200D), in one embodiment, is selected to inhibit bridging of a single block fraction of a block copolymer between contact points of interconnects ($t_2 > t_1$). As will be described in more detail herein, interconnections 140A-140H are formed, in one embodiment, by introducing a block copolymer into a confined trench through contact area 145. One of the polymers of the introduced block copolymer preferentially aligns with a contact point of an interconnect (interconnects 1200A-1200P) and the other with dielectric material in a DSA process. The polymer aligned with the interconnects is then modified or replaced with an electrically conductive material (e.g., a metal) to form interconnections 140A-140H. Finally, structure 100 includes an insulating dielectric material 150 of, for example, silicon dioxide disposed lateral to (adjacent) contact area 145.

FIG. 2 shows a cross-sectional side view of another embodiment of a 3D integrated circuit structure. Structure 200 includes substrate 210 of, for example, a semiconductor substrate such as bulk silicon or an SOI substrate. Substrate 210, in one embodiment, is a portion of a length substrate such as a wafer. Disposed on substrate 210 is array 220 of vertically stacked integrated circuit device components. The integrated circuit device components, in this embodiment, are transistor device layers of a particular conductivity (e.g., layers of P-type devices and layers of N-type devices). In one embodiment, device layers of transistor devices are individually formed on separate wafers and then transferred to substrate 210 to form array 220 or one device layer is formed on substrate 210 and the other device layers transferred to the substrate. In this embodiment, the device layers are connected in pairs. Each device layer includes laterally disposed contact points 225A-225P, respectively, of a metal or silicide with the respective contact points vertically aligned in contact area 245. FIG. 2 shows device layer 2200A electrically connected to device layer 2200B by interconnection 240A; device layer 2200C electrically connected to device layer 2200D by interconnection 240B; device layer 2200E electrically connected to device layer 2200F by interconnection 240C; device layer 2200G electrically connected to device layer 2200H by interconnection 240D; device layer 2200I electrically connected to device layer 2200J by interconnection 240E; device layer 2200K electrically connected to device layer 2200L by interconnection 240F; device layer 2200M electrically connected to device layer 2200N by interconnection 240G; and device layer 2200O electrically connected to device layer 2200P by interconnection 240H. In one embodiment, a connected pair of device layers (e.g., device layer 2200A and device layer 2200B) includes one P-type device layer (e.g., device layers 2200A, 2200C, 2200E, 2200G, 2200I, 2200K, 2200M and 2200O) and one N-type device layer (e.g., device layers 2200B, 2200D, 2200F, 2200H, 2200J, 2200L, 2200N and 2200P). Device layers 2200A-2200P are separated from one another and from substrate 210 by dielectric layer 230 of, for example, silicon dioxide or a low-k dielectric material. In one embodiment, interconnections 240A-240H are formed by a DSA process such as described with reference to FIG. 1. Accordingly, a thickness, $t_1$, of dielectric layer 230 between device layers of a connected pair allows a bridging of a single block fraction of a block copolymer to align with a contact point of each device layer. A thickness, $t_2$, of dielectric layer 230 between connected pairs of device layers, in one embodiment, is selected to inhibit bridging of a single block fraction of a block copolymer. Finally, adjacent to contact area 245 is dielectric layer 250 of, for example, silicon dioxide.

FIG. 3 shows another embodiment of a 3D integrated circuit structure each including a lateral contact point and electrically conductive interconnection connected to the contact points. Structure 300 is an example of the connection of multiple device layers, such as multiple transistor device layers through a vertical interconnection to form a single device (e.g., a single transistor with a large drive capacity analogous to a multi-fin device). Structure 300 includes substrate 310 such as a bulk silicon substrate or an SOI substrate. Disposed on substrate 310 are a number of device layers defining array 320. Representatively, one device layer may be formed on substrate 310 with the other device layers being transferred to form array 320. The device layers may be of the same or different conductivity type (P-type, N-type). Each device layer includes laterally disposed contact points 325A-325P, respectively, of, for example, a metal or a silicide. Contact points 325A-325P are vertically aligned in contact area 345 of the structure. FIG. 3 shows device layer 3200A electrically connected to device layer 3200B by interconnection 340A; device layer 3200C electrically connected to device layer 3200D by interconnection 340B; device layer 3200E electrically connected to device layer 3200F by interconnection 340C, device layer 3200G electrically connected to device layer 3200H by interconnection 340D; device layer 3200I electrically connected to device layer 3200J by interconnection 340E; device layer 3200K electrically connected to device layer 3200L by interconnection 340F; device layer 3200M electrically connected to device layer 3200N by interconnection 340G; and, device layer 3200O electrically connected to device layer 3200P by interconnection 340H. In addition, structure 300 includes device layers 3200E-3200H electrically connected by interconnection 340H and device layers 3200M-3200P electrically connected by interconnection 340I. In one embodiment, device layers 3200A-3200H are one conductivity type (e.g., P-type) and device layers 3200I-3200P are second conductivity type (e.g., N-type). The individual device layers are electrically insulated from one another by dielectric material 330 of, for example, silicon dioxide or a low-k dielectric material. In one embodiment, interconnections 340A-340H are formed by a DSA process such as described above with reference to FIG. 1. In one embodiment, a thickness, $t_1$, of dielectric layer 330 between device layers of a connected pair allows a bridging of a single block fraction of a block copolymer to align with a contact point of each device layer. A thickness, $t_3$, between two connected pairs (e.g., device layers 3200M and 3200N and devices layers 3200O and 3200P) similarly allows bridging. A thickness, $t_2$, of dielectric layer 330 between connected pairs of device layers, in one embodiment, is selected to inhibit bridging of a single block fraction of a block copolymer. Finally, adjacent to contact area 345 is dielectric layer 350 of, for example, silicon dioxide or a low-k material.

FIG. 4 shows cross-sectional side view of another embodiment of a 3D device structure. Structure 400, in this embodiment, includes an array of vertically stacked CMOS device layers each separated by a dielectric layer. Referring to FIG. 4, structure 400 includes substrate 410 such as a bulk silicon substrate or an SOI structure. Disposed on substrate 410 is array 420 of CMOS layers each insulated by dielectric layer 430 of, for example, silicon dioxide or a low-k dielectric material. Representatively, one device layer may be formed on substrate 410 with the other device layers being transferred to form array 420. Each device layer includes contact point 425 such as a metal or a silicide. Laterally disposed contact points 425A-425P, respectively, of a metal or a silicide are aligned vertically in contact area 445. FIG. 4 shows device layer 4200A electrically connected to device layer 4200B by interconnection 440A; device layer 4200C electrically connected to device layer 4200D by interconnection 440B; device layer 4200E electrically connected to device layer 4200F by interconnection 440C; device layer 4200G electrically connected to device layer 4200H by interconnection 440D; device layer 4200I electrically connected to device layer 4200J by interconnection 440E; device layer 4200K electrically connected to device layer 4200L by interconnection 440F; device layer 4200M electrically connected to device layer 4200N by interconnection 440G; and device layer 4200O electrically connected to device layer 4200P by interconnection 440H. In one embodiment, interconnections 440A-440H are formed by a DSA process such as described above with reference to FIG. 1. In one embodiment, a thickness, $t_1$, of dielectric layer 430 between device layers of a connected pair allows a bridging of a single block fraction of a block copolymer to align with a contact point of each device layer. A thickness, $t_2$, of dielectric layer 430 between connected pairs of device layers, in one embodiment, is selected to inhibit bridging of a single block fraction of a block copolymer. Adjacent to contact area 445 is dielectric layer 450 of, for example, silicon dioxide or a low-k material.

In the embodiment described with reference to FIGS. 1-4, the 3D integrated circuit device structures illustrated interconnection of vertically stacked layers of integrated circuit device component on one lateral side of the respective device layers (one side of the array). In another embodiment, the device layers may also be connected on adjacent and/or opposite sides of the device layers allowing for multiple patterning of interconnections on multiple sides of an array.

FIG. 5 shows a cross-sectional side view of another embodiment of an integrated circuit device structure including two vertically stacked arrays of integrated circuit device components with interconnections of device layers of the respective arrays formed on opposite sides of the arrays. In this embodiment, structure 500 includes substrate 510 that is, for example, a bulk silicon substrate or an SOI substrate. Disposed on substrate 510 is array 520A and array 520B, each array including a member of device layers that, in this embodiment, are device layers of transistor devices of one conductivity (e.g., P-type) electrically connected to a device layer of another device (e.g., N-type). It is appreciated that the array is representative and that different types of array are contemplated (e.g., any of the arrays described with reference to FIGS. 1-4). In the embodiment of FIG. 5, each device layer is insulated by dielectric material 530 of, for example, silicon dioxide or a low-k dielectric material with a thickness, $t_1$, of dielectric layer between connected device layers selected to allow bridging of a single block fraction of a block copolymer and a thickness, $t_2$, of the dielectric layer between connected pairs of device layers being selected to inhibit bridging. Each device layer includes a laterally disposed contact point. FIG. 5 shows the device layers constituting array 520 each include a contact point (indicated by contact point 525A) of, for example, a metal or a silicide and the device layers constituting array 520B each include a contact point (illustrated by contact point 525B). The contact points (525A-525B) of the device layers are aligned vertically in contact area 560. In this embodiment, a device layer of one conductivity type is connected to a device layer of another conductivity type in contact area 560 by an electrically conductive interconnection. FIG. 5 representatively shows interconnection 540A connecting two of the device layers of array 520A and interconnection 540B connecting two of the device layers of array 520B. As will be described further, interconnections 540A and 540B are formed using a direct self-assembly (DSA) technique. The DSA technique allows a lateral separation of arrays 520A and 520B (denoted by contact area 560) to be as small as on the order of 8 nanometers (nm) to 10 nm and as large as many tens of nanometers.

DSA is a process where a chemical guide on a surface of a substrate is used to align a polymer. To form the interconnections by way of the DSA technique, in one embodiment, graphoepitaxy and chemoexpitaxy are employed. Graphoepitaxy is initially used to confine a volume for self-assembly and to form a pattern on which polymers of a block copolymer will assemble (confinement comes laterally through a fixed-width opening for formation of a vertical interconnect). Using chemoepitaxy, polymer molecules nominally called "brushes" are then introduced in the confined volume and align in an ordered manner to the existing pattern. These molecules interact favorably with one of the block fractions (a 1-brush or single color scheme), or two brushes may be used that interact with one block fraction but not the other (a 2-brush or two color scheme).

Figure 6:
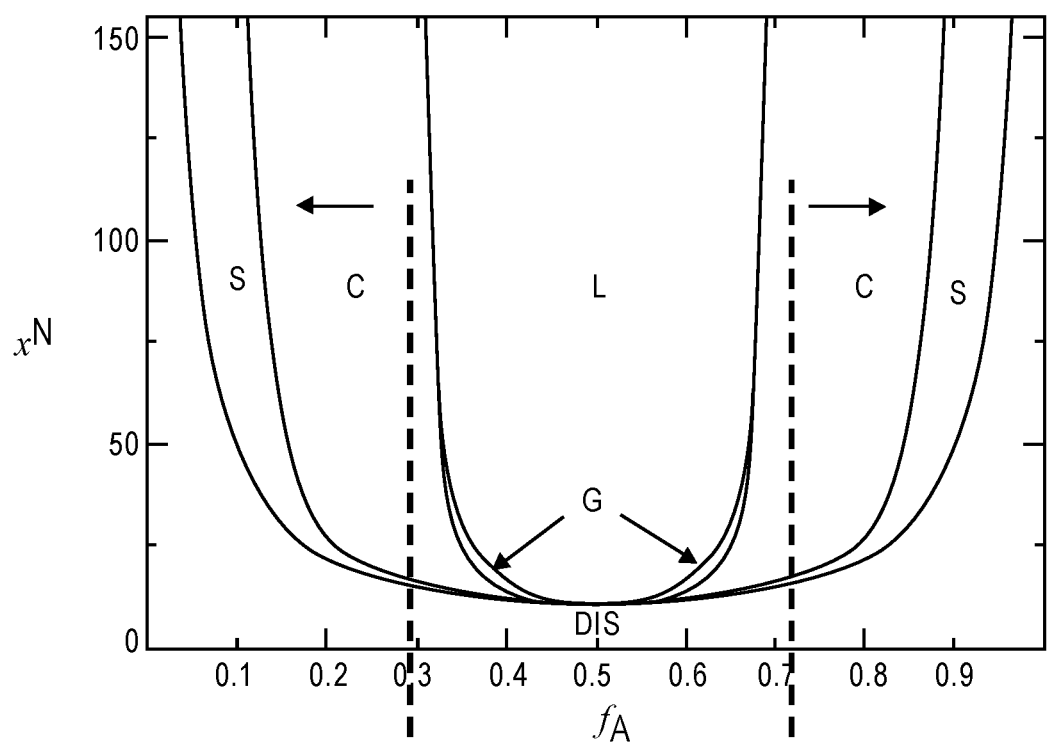
FIG. 6 shows a phase diagram for a PS-b-PMMA block copolymer.

Brushes/polymers for a DSA process are commercially available. The polymers can be readily engineered to provide different properties; one key parameter of interest is the Flory-Huggins X parameter which describes how energetically favorable it is for the polymers to mix. By controlling this parameter, a morphology of the resultant system when the polymers are mixed in contact with a metallic or insulating surface can be controlled. For example, polystyrene-bpolymethylmethacrylate (PS-b-PMMA) can be formulated in a symmetric 50:50 blend that produces lamellar self-assembled domains. If this fraction is adjusted to 30:70 or 70:30, the polymer produces cylinders of the minority fraction assembled in a hexagonal pattern in a sea of the majority fraction. The effect of changing the relative ratios of polystyrene (PS) to polymethylmethacrylate (PMMA) is shown in FIG. 6 upon the resultant morphologies of the polymer system. FIG. 6 shows a phase diagram for a PS-b-PMMA block copolymer and demonstrates the different morphologies as a block fraction of either PS or PMMA relative to the other of PS or PMMA. Either polymer may be considered since the phase diagram is symmetric about $f_A$=0.5. In FIG. 6, L represents an area where lamellar self-assembled domains are dominant; G where gyroid domains are dominant; C where cylindrical domains are dominant; and S where spherical domains are dominant. In one embodiment, $f_A$ values which produce cylindrical or spherical morphologies are used in a DSA process to form interconnections of device layers.

Figure 7:
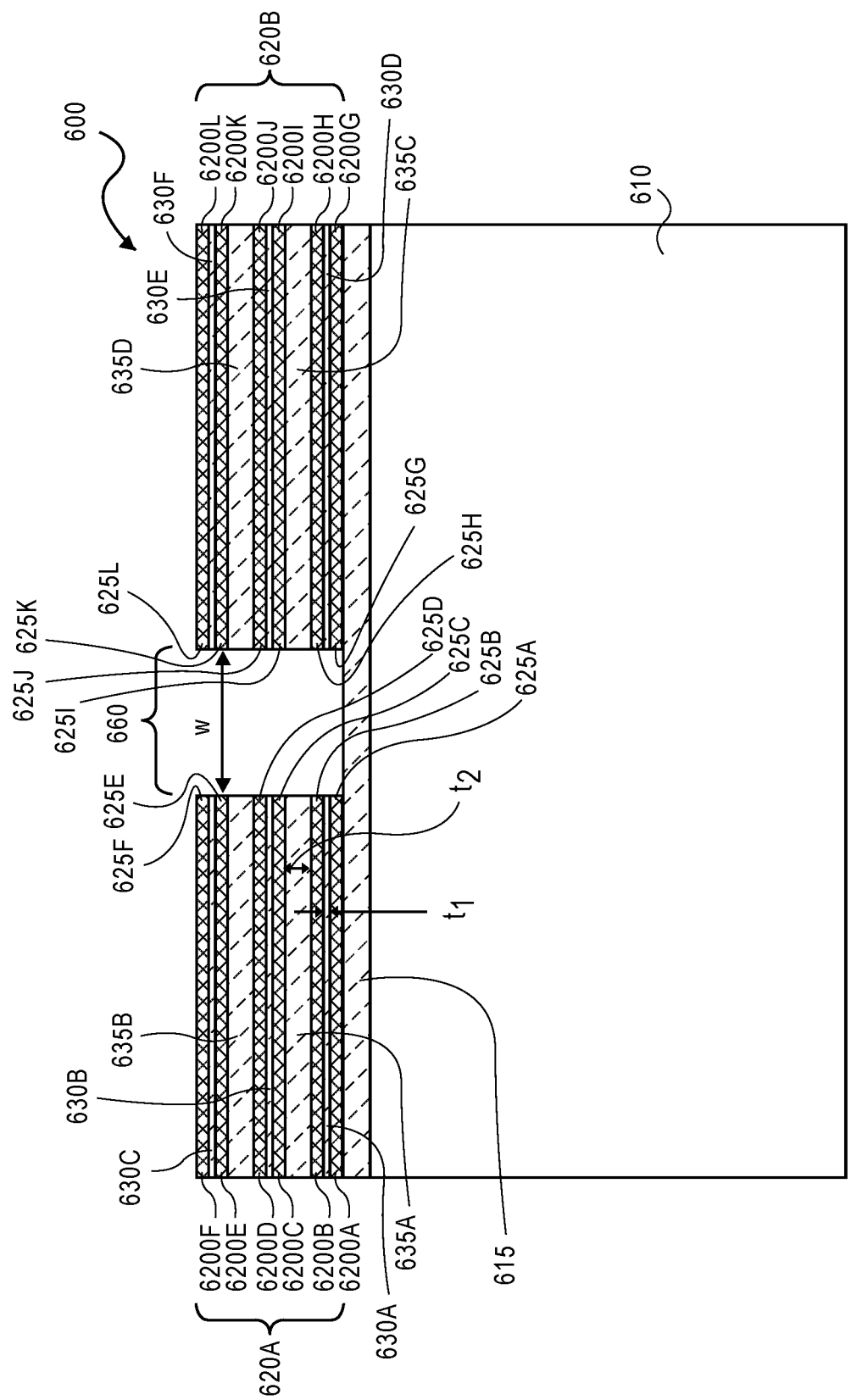
FIG. 7 shows a cross-sectional side view of another embodiment of a structure including a substrate and two vertically stacked arrays of integrated circuit device components on the substrate and a trench formed through a contact area of each array.

FIGS. 7-13 describe a process for forming interconnections to vertically stacked layers of integrated circuit device components. FIG. 14 presents a flow chart of an embodiment of the process. FIG. 7 shows structure 600 including substrate 610 of a semiconductor material such as a bulk silicon or an SOI substrate. Disposed on a surface of substrate 610 is dielectric layer 615 of silicon dioxide or a low-k dielectric material. In one embodiment, dielectric layer 615 has a thickness on the order of 20 nm, but may be as small as 10 nm and as large and many hundreds of nm. Disposed on dielectric layer 615 is vertically stacked array 620A and array 620B. Each array consists of vertically stacked layers of integrated device components such as interconnects or transistor devices. The component layers, in this embodiment, are paired. FIG. 7 shows array 620A includes component layer 6200A, component layer 6200B, component layer 6200C, component layer 6200D, component layer 6200E and component layer 6200F on dielectric layer 615. In this embodiment, component layer 6200A is separated from component layer 6200B by dielectric layer 630A; component layer 6200D is separated from component layer 6200C by dielectric layer 630B; and device 6200F is separated from component layer 6200E by dielectric layer 630C. Dielectric layers 630A-630C are each silicon dioxide or a low-k dielectric or other electrically insulating material. A thickness, $t_1$, of dielectric layers 630A-630C is selected as dielectric insulator region to be less than an intrinsic periodicity required for a bridging of a polymer in a DSA process. The separation distance $t_1$ may be as small as a few (2-3) nm, but as large as many tens of nm depending upon the layer thicknesses for 6200A-F. A connected pair of component layers in array 620A is separated from another connected pair of component layers by a dielectric layer. FIG. 7 shows dielectric layer 635A between component layer pair of 6200A/6200B and 6200C/6200D and dielectric layer 635B between component layer pair of 6200C/6200D and 6200E/6200F. Dielectric layers 635A and 635B are each silicon dioxide or a low-k dielectric material and have a thickness, $t_2$, selected to inhibit bridging of a polymer between adjacent component layer pairs in a DSA process. Array 620B includes component layer 6200G, component layer 6200H, component layer 6200I, component layer 6200J, component layer 6200K and component layer 6200L on dielectric layer 615. In this embodiment, component layer 6200G is separated from component layer 6200H by dielectric layer 630D; component layer 6200J is separated from component layer 6200I by dielectric layer 630E; and device 6200L is separated from component layer 6200K by dielectric layer 630F. Dielectric layers 630D-630F are each silicon dioxide or a low-k dielectric material or other insulating material. A thickness of dielectric layers 630D-630F is selected as dielectric insulator region to be less than an intrinsic periodicity required for a bridging of a polymer in a DSA process. A representative thickness may be as small as a few (2-3) nm, but as large as many tens of nm depending upon the layer thicknesses. A connected pair of component layers in array 620B is separated from another connected pair of component layer by a dielectric layer. FIG. 7 shows dielectric layer 635C between component layer pair 6200G/

6200H and 6200I/6200J and dielectric layer 635D between component layer pair 6200I/6200J and 6200K/6200L. Each of component layers 635C and 635D are, for example, silicon dioxide or a low-k dielectric material and have a thickness to inhibit bridging of a polymer between adjacent component layer pairs in a DSA process (e.g., a thickness greater than an intrinsic periodicity required for a bridging of a polymer).

Each of the component layers in array 620A and array 620B includes a laterally disposed contact point such as a metal or silicide electrical conductor in contact area 660. FIG. 7 shows contact point 625A of component layer 6200A; contact point 625B of component layer 6200B; contact point 625C of component layer 6200C; contact point 625D of component layer 6200D; contact point 625E of component layer 6200E; contact point 625F of component layer 6200F; contact point 625G of component layer 6200G; contact point 625H of component layer 6200H; contact point 625I of component layer 6200I; contact point 625J of component layer 6200J; contact point 625K of component layer 6200K; and contact point 625L of component layer 6200L. In this embodiment, each contact point is defined by a lateral edge exposed in the trench having a thickness dimension. In the embodiment illustrated, a thickness dimension of the lateral edge of the contact point is equivalent to a thickness of a corresponding component layer. FIG. 7 shows structure 600 following a formation of a trench in contact area 660 to expose a contact point of each component layer (block 710, FIG. 14). A trench may be formed by photolithographic techniques by, for example, forming a mask on a surface of structure 600 having an opening to contact area 660 and then etching the trench into the structure with an appropriate etchant. In one embodiment, the trench has a width, w, sufficient to expose contact points for each component layer and to confine a volume for self-assembly of polymers according to a graphoepitaxy approach. A representative width, w, of a trench is on the order of 8 nm to many tens of nm (ie 80 nm or more).

Following the forming of a trench, target brushes are grafted to contact points 625A-625L of component layers 6200A-6200L, respectively, and to the dielectric layers between the component layers (dielectric layers 630A-630F) (block 715, FIG. 14). Using the example of a polystyrene-b-polymethylmethacrylate (PS-b-PMMA) adjusted to PS:PMMA of 30:70, it is desired to assemble a PS component over the contact points (e.g., over metal/silicide) and to assemble a PMMA component over the dielectric material. In one embodiment, a PS-attractive thiol brush is grafted directly to contact points 625A-625L. Representatively, PS-attractive thiol brushes are commercially available for grafting to copper, ruthenium, cobalt and tungsten. Thus, in one embodiment, contact points 625A-625L are selected of a material of copper, ruthenium, cobalt or tungsten. Similarly, a second brush, based, for example, on an alcohol or phosphate end group is grafted to dielectric layers 630A-630F and optionally dielectric layers 635A-635D. The brushes are selectively bonded through a wet chemical process that is conducted in the presence of a solvent. The solvent is subsequently driven off with a thermal anneal.

Following the grafting of the brushes to contact points 625A-625L and dielectric layers 630A-630F, respectively, a block copolymer of PS-b-PMMA in, for example, a PS:PMMA ratio of 30:70 ratio is introduced in the trench with a solvent as a liquid (block 720, FIG. 14). In this embodiment, the PS aligns with the contact points through the PS-attractive thiol brush and PMMA aligns with the dielectric material brush. Where dielectric layers 630A-630F are selected such that a distance between adjacent component layers is less than an intrinsic periodicity of the PS-b-PMMA polymer, the PS component will bridge dielectric layers 630A-630F, respectively. Where dielectric layers 635A-635D are selected to be greater than an intrinsic periodicity of the PS-b-PMMA polymer, no bridging will occur. A deposition of the polymer is followed by a thermal anneal to drive off the solvent and promote the self-assembly of the polymers (block 722, FIG. 14).

Figure 8:
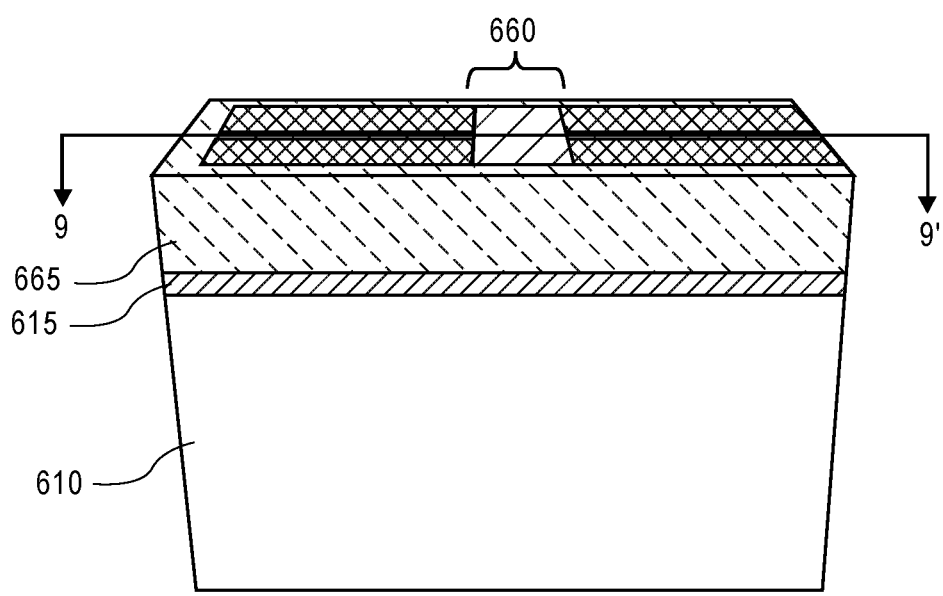
FIG. 8 shows a top side view of the structure of FIG. 7 following the introduction of a DSA block copolymer in the trench in a contact area.
Figure 9:
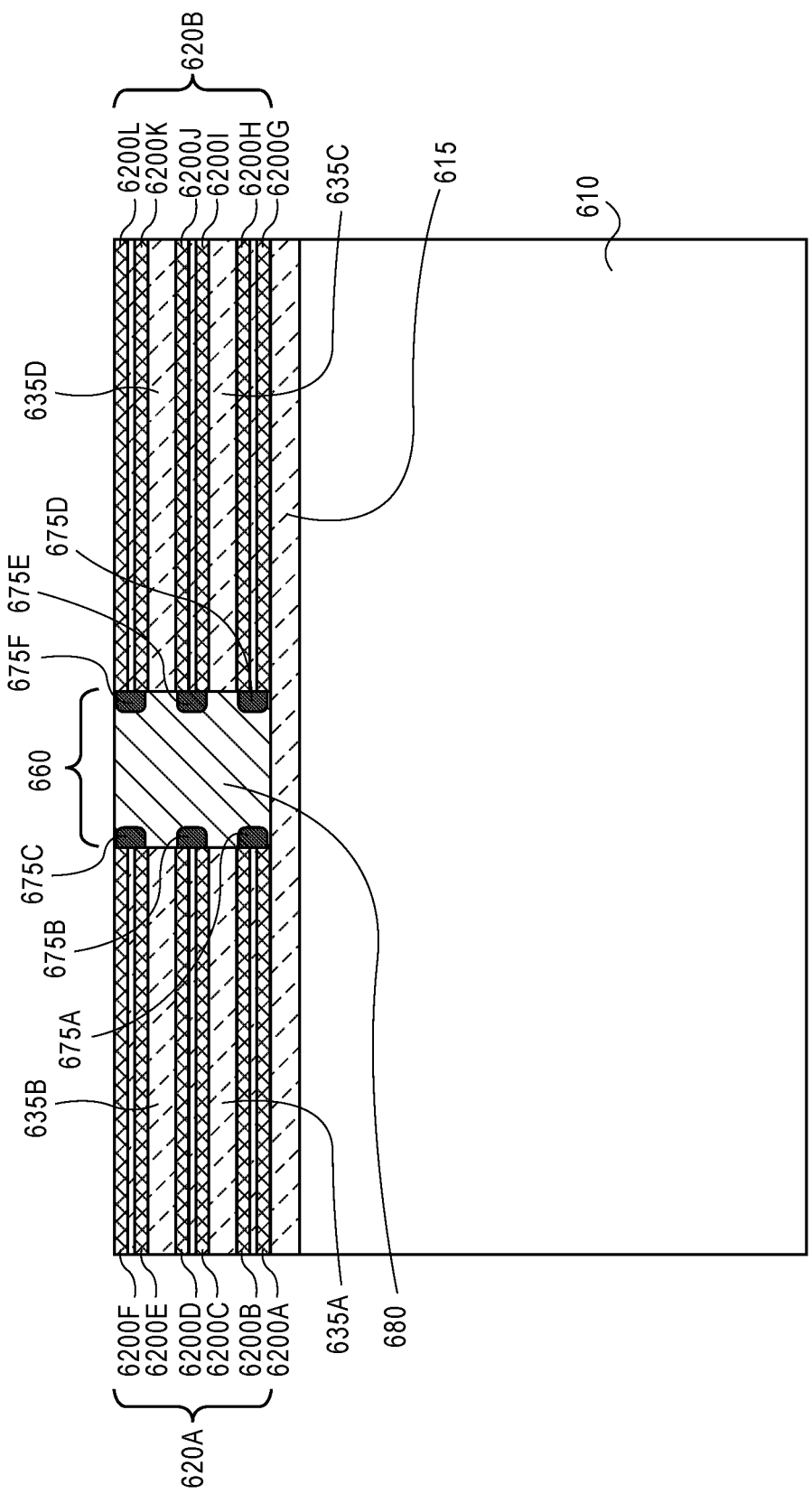
FIG. 9 shows a cross-section of the structure of FIG. 8 through line 9-9'.

FIG. 8 shows a top side view of the structure of FIG. 7 following the introduction of the PS-b-PMMA polymer in the trench in contact area 660. FIG. 9 shows a cross-section of the structure of FIG. 8 through line 9-9'. As shown in FIG. 9, the polymer introduced in the trench through contact area 660 has self-assembled so that the PS component aligns to contact points of each component layer and, where the component layers are separated by dielectric layers 630A-630F having a width that is less than an intrinsic periodicity of the polymer, the PS polymer bridges between two component layers. FIG. 9 shows PS polymer 675A connected to a contact point of component layer 6200A and component layer 6200B; PS polymer 675B connected to a contact point of component layer 6200C and component layer 6200D; PS polymer 675C connected to a contact point of component layer 6200E and component layer 6200F; PS polymer 675D connected to a contact point of component layer 6200G and component layer 6200H; PS polymer 675E connected to a contact point of component layer 6200I and component layer 6200J; and PS polymer 675F connected to a contact point of component layer 6200K and component layer 6200L. In this embodiment, dielectric layers 635A-635D are each of a thickness greater than the intrinsic periodicity of the polymer so that a PS polymer in the trench through contact area 660 cannot bridge such thickness. As shown in FIG. 8, the component layer arrays (array 620A, array 620B) are wrapped with insulating gap-fill material 665. One suitable insulating gap-fill material 665 is a silicon dioxide or flowable silicon oxide layer. In one embodiment, insulating gap-fill material 665 is selected for its etch selectivity relative to the materials of the device stack. In one embodiment, array 620A and array 620B are wrapped in a first insulating spacer material such as a carbide or an oxide and then wrapped with insulating gap-fill material 665 that has different etch properties relative to the spacer material. In this embodiment, the device arrays will be protected by the spacer material from any etch of insulating gap-fill material 665.

Figure 10:
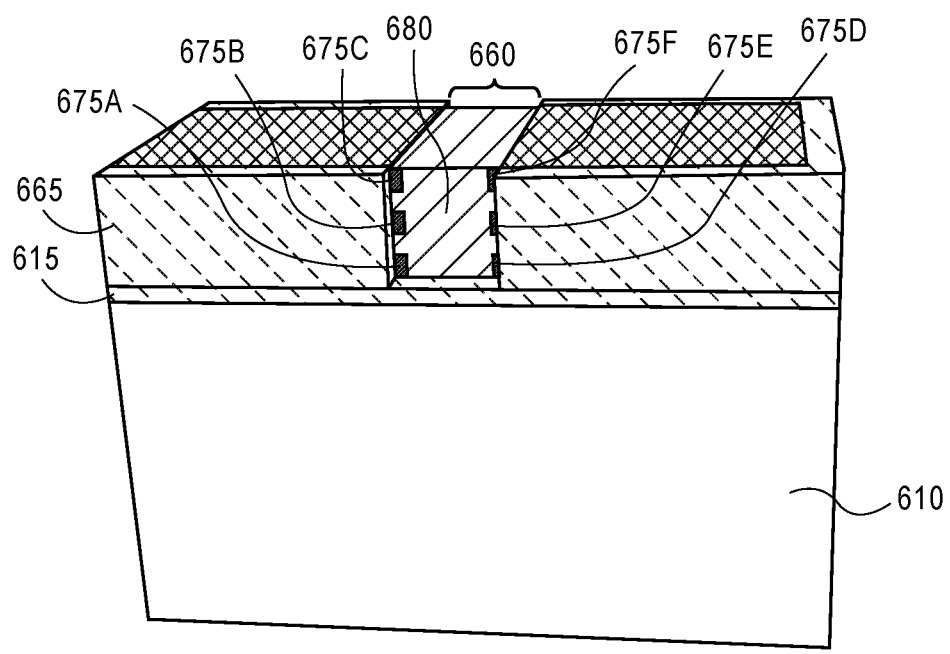
FIG. 10 shows the structure of FIG. 8 following the opening of the polymer-containing trench to the side (a front side as viewed).

FIG. 10 shows the structure of FIG. 8 following the opening of the polymer-containing trench to the side (a front side as viewed) (block 725, FIG. 14). The exposure of the polymer-contained trench to the side may be performed by lithographic and dry etch techniques of insulating gap-fill material 665. Where the component layers are wrapped in a spacer material and insulating gap-fill material and spacer material has different etch properties than insulating gap-fill material 665 for particular etchants, such spacer material can protect arrays 620A and 620B from an etch of insulating gap-fill material 665. In another embodiment, a hard mask may be placed on a superior surface of arrays 620A and 620B and/or the polymer-filled trench.

Once the polymer-filled trench is exposed, one of the polymers in a trench (PS or PMMA) may be removed with a wet or dry chemical etch process. In one embodiment, an etch is a plasma reactive ion etch known for removing polymer components selectively. Representatively, PMMA polymer 680 has a higher etch rate relative to PS polymers 675A-675F using argon/oxygen (Ar/$O_2$), argon (Ar), nitrogen/hydrogen ($N_2/H_2$) and argon/carbon monoxide/nitrogen (Ar/CO/$N_2$) etch chemistries. Wet etches using acetic acid are also generally selective to PMMA polymer 680 relative to PS polymers 675A-675D.

Figure 11:
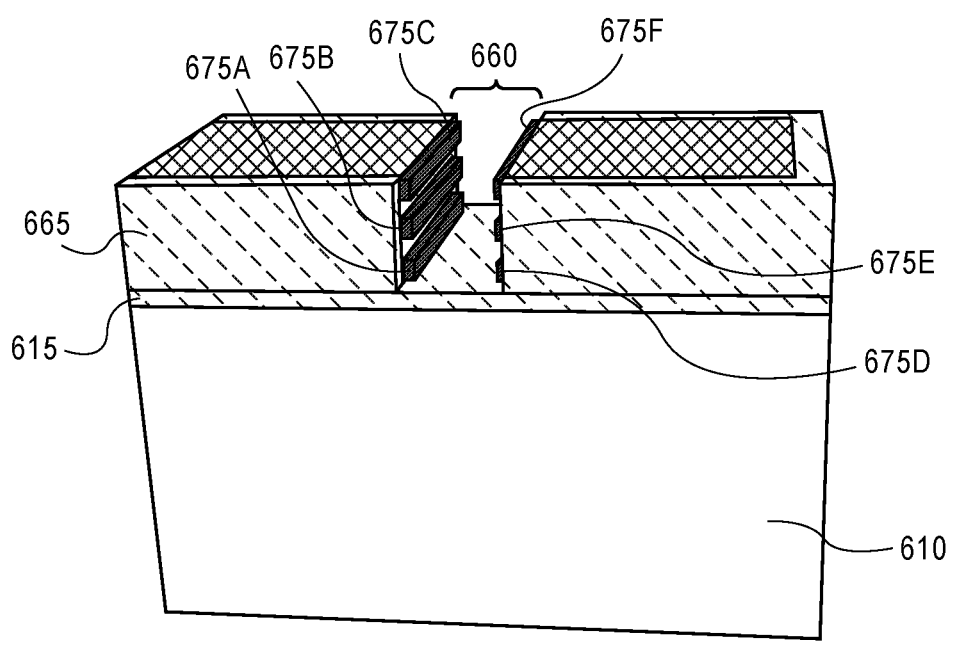
FIG. 11 shows the structure of FIG. 10 following a removal of one polymer of the block copolymer in the contact area.

FIG. 11 shows the structure of FIG. 10 following a removal of PMMA polymer 680 (the non-bridging polymer) in contact area 660 (block 730, FIG. 14). The removal of PMMA polymer 680 leaves PS polymers 675A-675D connected to respective contact points of the component layer arrays (device array 620A and device array 620B).

Figure 12:
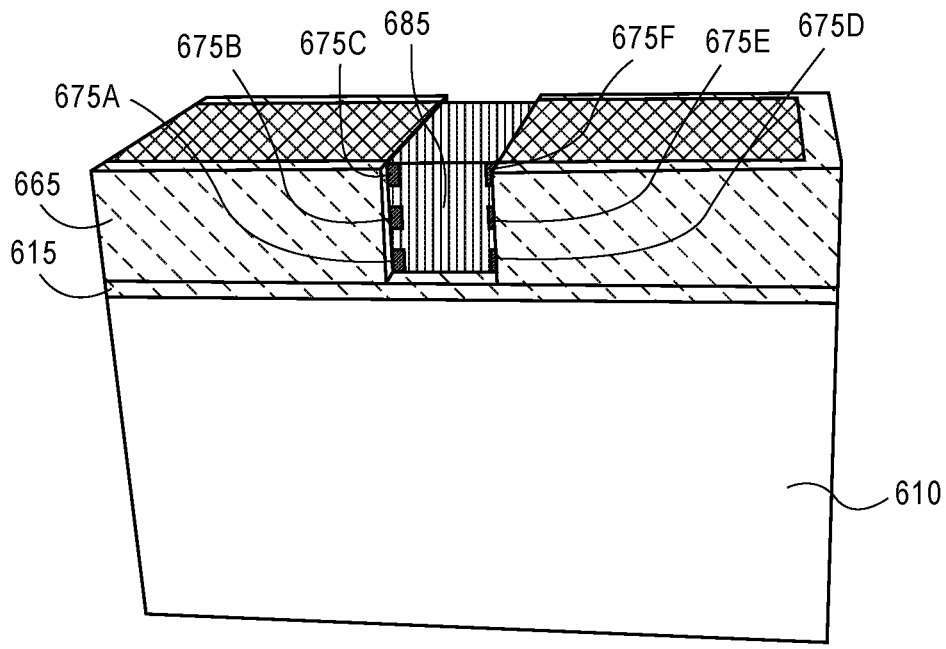
FIG. 12 shows the structure of FIG. 11 following the introduction of a material in the contact area to replace the removed polymer.

FIG. 12 shows the structure of FIG. 11 following the introduction of a material in contact area 660 to replace the removed PMMA polymer (block 735, FIG. 14). In one embodiment, material 685 is a dielectric material such as silicon dioxide or other suitable material that may be introduced by a low temperature process such as a low temperature chemical vapor deposition process or a spin-on like process or a gap-fill or other means. Dielectric layer 685 provides a mechanically stable layer that allows further processing to modify or replace PS polymers 675A-675D.

Figure 13:
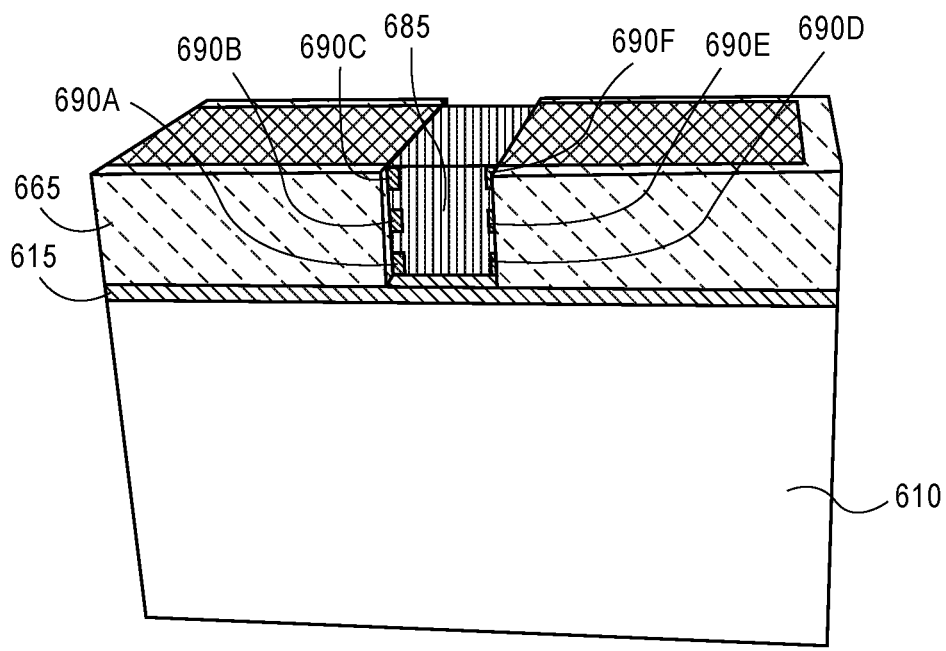
FIG. 13 shows the structure of FIG. 12 following a modification or replacement of the remaining polymer with a conductive material.
Figure 14:
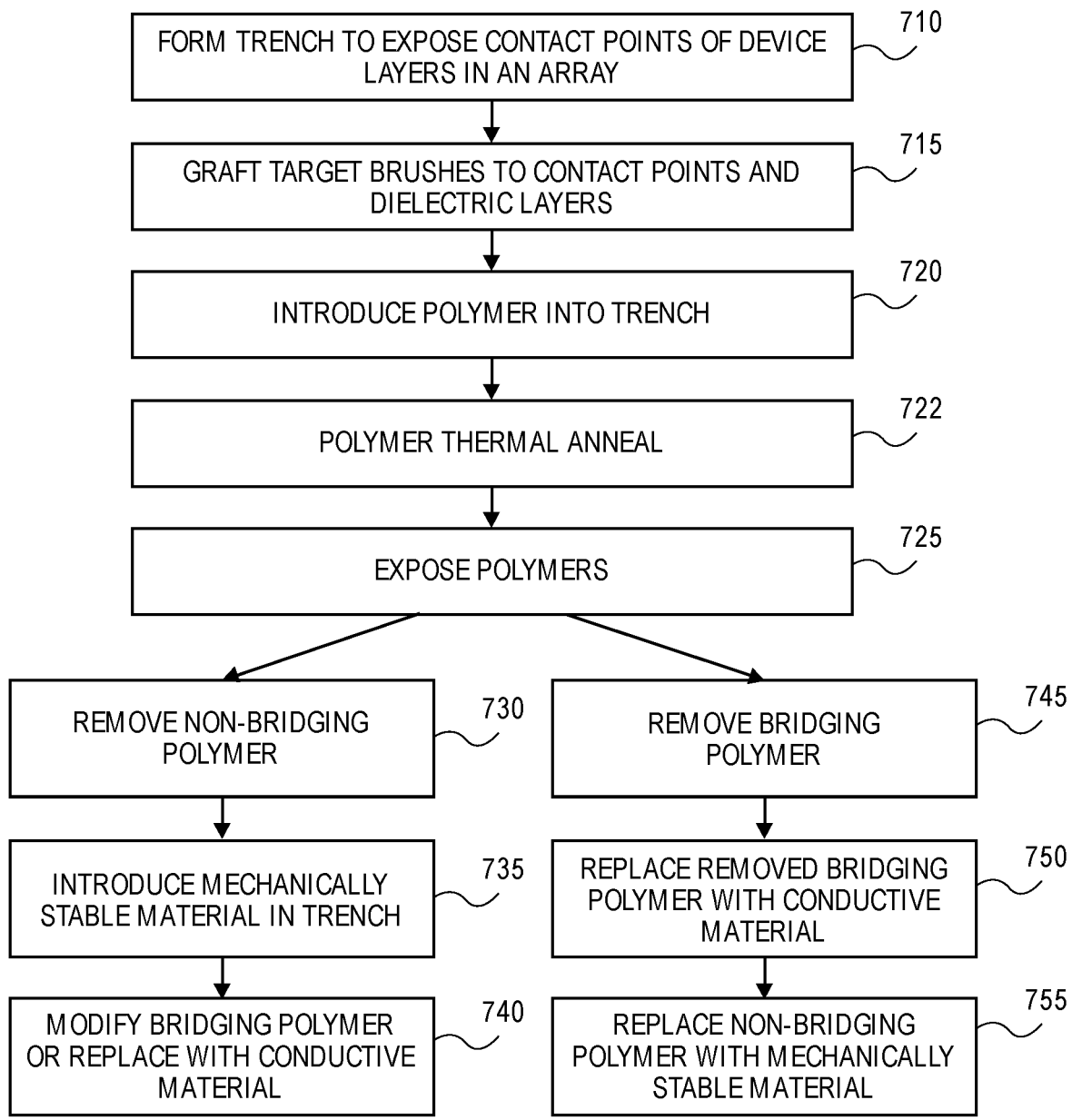
FIG. 14 presents a flow chart of an embodiment of the process.

FIG. 13 shows the structure of FIG. 12 following a modification or replacement of PS polymers 675A-675F (block 740, FIG. 14). In one embodiment, PS polymers 675A-675F are removed. One way to remove PS polymers 675A-675F is by a wet etch using chemistries such as noted above. PS may also be selectively dry etched with an oxygen/helium plasma. Following a removal of the polymers, the region vacated is replaced with an electrically conductive material such as a metal. This could be done by way of a vapor-phase CVD process. FIG. 13 shows conductive material 690A having replaced PS polymer 675A; conductive material 690B having replaced PS polymer 675B; conductive material 690C having replaced PS polymer 675C; conductive material 690D having replaced PS polymer 675D; conductive material 690E having replaced PS polymer 675E; and conductive material 690F having replaced PS polymer 675F. In one embodiment, the conductive material (conductive materials 690A-690F) extends across at least a portion including an entire portion of a lateral edge of the contact points to which it is connected as opposed to, for example, being connected to a top or bottom surface of a contact point. In one embodiment, it is not necessary to completely fill the vacated region. A timed wet etch may optionally be performed to remove any undesired metal that is deposited inside the side opening of insulating gap-fill material 665. At this stage in processing, the opening in insulating gap-fill material 665 may be filled with dielectric or gap-fill material and further processing of the structure may take place as desired.

In the above embodiment, the PS polymer bridging contact points of the component layers is replaced. In another embodiment, such polymer may be retained and modified by, for example, driving a conductor into the polymer to form conductive whiskers. Representatively, aluminum may be driven into a polymer such as a PMMA or PS polymer by exposing a sidewall opening to aluminum followed by a low temperature thermal process.

In the above method, the non-bridging PMMA polymer is removed once the polymers in the trench are exposed through the side opening in insulating gap-fill material 665. In another embodiment, the bridging PS polymer may be removed and the non-bringing PMMA retained. According to that method and referencing the process flow of FIG. 14, once the polymers are exposed, PS polymers 675A-675D (the bridging polymer) may be removed by a selective etch (block 745, FIG. 14). Once the bridging PS polymer is removed (PS polymers 675A-675D), the vacated region would be replaced with a conductive material by, for example, a vapor phase CVD process (block 750, FIG. 14). Following the replacement of the bridging polymer with a conductive material, the non-bridging PMMA polymer may be replaced with mechanically stable materials such as silicon dioxide or other dielectric material (block 755, FIG. 14).

Figure 15:
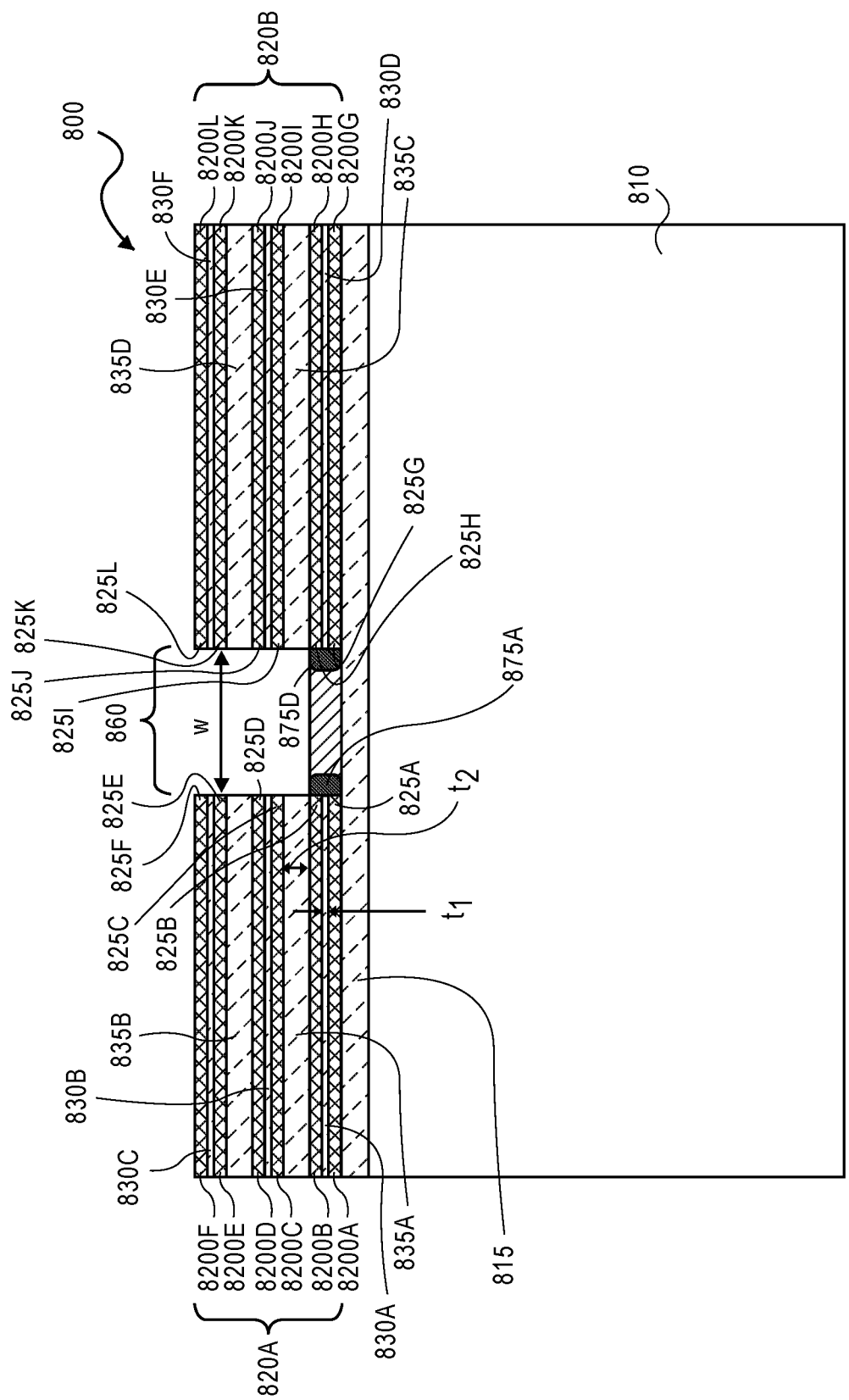
FIG. 15 shows a cross-sectional side view of an integrated circuit substrate including two vertically stacked arrays of integrated circuit device components, a trench formed through a contact area of each array and a polymer composition disposed in a base of the trench with one of two polymers of polymer composition aligned with contact points of pairs of integrated circuit device components.

FIGS. 15-23 describe an alternative process for forming interconnections to vertically stacked layers of integrated circuit device components. The process is a "bottom up" process that does not require accessing the ordered polymer from a side of the stack. Referring to FIG. 15, FIG. 15 shows structure 800 including substrate 810 of a semiconductor material such as a bulk silicon or an SOI substrate. Disposed on a surface of substrate 810 is dielectric layer 815 of silicon dioxide or a low-k dielectric material. Disposed on dielectric layer 815 is vertically stacked array 820A and array 820B. Each array consists of vertically stacked layers of integrated device components such as interconnects or transistor devices. The component layers, in this embodiment, are paired. FIG. 15 shows array 820A includes component layer 8200A, component layer 8200B, component layer 8200C, component layer 8200D, component layer 8200E and component layer 8200F on dielectric layer 815. In this embodiment, component layer 8200A is separated from component layer 8200B by dielectric layer 830A; component layer 8200D is separated from component layer 8200C by dielectric layer 830B; and device 8200F is separated from component layer 8200E by dielectric layer 830C. Dielectric layers 830A-830C are each silicon dioxide or a low-k dielectric material and have a thickness selected as or operable as dielectric insulator region to be less than an intrinsic periodicity required for a bridging of a polymer in a DSA process. A representative thickness is on the order of a few nm (2-3), but may be as large as many tens of nm. A connected pair of component layers in array 820A is separated from another connected pair of component layers by a dielectric layer. FIG. 15 shows dielectric layer 835A between component layer pair of 8200A/8200B and 8200C/8200D and dielectric layer 835B between component layer pair of 8200C/8200D and 8200E/8200F. Dielectric layers 835A and 835B are each silicon dioxide or a low-k dielectric material and have a thickness selected to or operable to inhibit bridging of a polymer between adjacent component layer pairs in a DSA process. Array 820B includes component layer 8200G, component layer 8200H, component layer 8200I, component layer 8200J, component layer 8200K and component layer 8200L on dielectric layer 815. In this embodiment, component layer 8200G is separated from component layer 8200H by dielectric layer 830D; component layer 8200J is separated from component layer 8200I by dielectric layer 830E; and device 8200L is separated from component layer 8200K by dielectric layer 830F. Dielectric layers 830D-830F are each silicon dioxide or a low-k dielectric material or other insulating material. A thickness of dielectric layers 830D-830F is selected as dielectric insulator region to be less than an intrinsic periodicity required for a bridging of a polymer in a DSA process. A representative thickness is on the order of a few nm (2-3), but may be as large as many tens of nm. A connected pair of component layers in array 820B is separated from another connected pair of component layer by a dielectric layer. FIG. 15 shows dielectric layer 835C between component layer pair 8200G/8200H and 8200I/8200J and dielectric layer 835D between component layer pair 8200I/8200J and 8200K/8200L. Each of component layers 835C and 835D are, for example, silicon dioxide or a low-k dielectric material and have a thickness to inhibit bridging of a polymer between adjacent component layer pairs in a DSA process (e.g., a thickness greater than an intrinsic periodicity required for a bridging of a polymer).

Each of the component layers in array 820A and array 820B includes a laterally disposed contact point such as a metal or silicide electrical conductor in contact area 660. FIG. 15 shows contact point 825A of component layer 8200A; contact point 825B of component layer 8200B; contact point 825C of component layer 8200C; contact point 825D of component layer 8200D; contact point 825E of component layer 8200E; contact point 825F of component layer 8200F; contact point 825G of component layer 8200G; contact point 825H of component layer 8200H; contact point 825I of component layer 8200I; contact point 825J of component layer 8200J; contact point 825K of component layer 8200K; and contact point 825L of component layer 8200L.

FIG. 15 shows structure 800 following a formation of a trench in contact area 860 to expose a contact point of each component layer. A trench may be formed by photolithographic techniques by, for example, forming a mask on a surface of structure 800 (a superior surface as viewed), the mask having an opening to contact area 660 and then etching the trench into the structure with an appropriate etchant. In one embodiment, the trench has a width, w, sufficient to expose contact points for each component layer and to confine a volume for self-assembly of polymers according to a graphoepitaxy approach. A representative width, w, of a trench is on the order of 8 nm to many tens of nm (i.e., 80 nm or more).

Following the forming of a trench, contact brushes are grafted to contact points of the component layers closest to substrate 810 (the lowest level devices layers). The lowest level component layers in this embodiment are component layers 8200A and 8200B of array 820A and component layers 8200G and 8200H of array 820B. Contact brushes are grafted to contact points 825A, 825B, 825G and 825H, respectively and to the dielectric layers between the component layers (dielectric layers 830A-830D). Using the example of a polystyrene-b-polymethylmethacrylate (PS-b-PMMA) adjusted to PS:PMMA of 30:70, and the desire to assemble a PS component over the contact points (e.g., over metal/silicide) and to assemble a PMMA component over the dielectric material, in one embodiment, a PS-attractive thiol brush is grafted directly to contact points 825A, 825B, 825G and 825H, respectively. Similarly, a second contact brush, based, for example, on an alcohol or phosphate end group is grafted to dielectric layers 830A and 830G and optionally dielectric layer 815. A grafting process may be similar to that described above with reference to FIG. 9 and FIG. 14 including selectively bonding the contact brushes through a wet chemical process that is conductive in the presence of a solvent than subsequently driving off the solvent with a thermal treatment.

Following the grafting of the brushes to contact points 825A, 825B, 825G and 825H, respectively and dielectric layers 830A and 830G, respectively, a block copolymer of PS-b-PMMA in a PS:PMMA ratio of 30:70 ratio is introduced in the trench in a solvent as a liquid. The solvent is then driven off with a thermal treatment. In this embodiment, the PS aligns with the contact points through the PS-attractive thiol brush and PMMA aligns with the dielectric material brush. Where dielectric layers 830A and 830G are selected such that a distance between adjacent component layers is less than an intrinsic periodicity of the PS-b-PMMA polymer, the PS component will bridge dielectric layers 830A and 630G, respectively. FIG. 15 shows PS polymer 875A connected to contact point 825A and contact point 825B and PS polymer 875D connected to contact point 825G and contact point 825H with PMMA polymer 880A disposed between the PS polymers.

Figure 16:
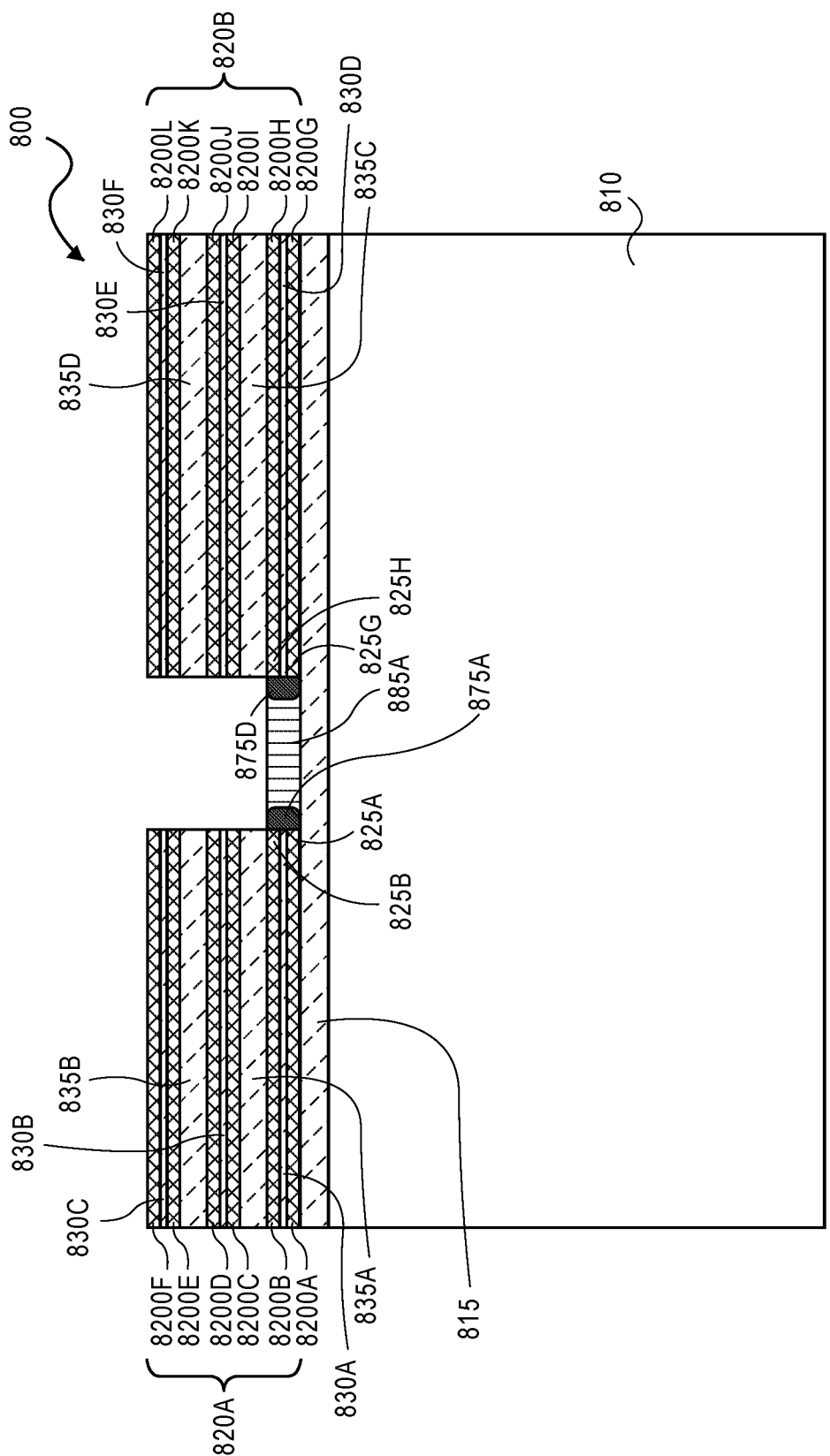
FIG. 16 shows the structure of FIG. 15 following a removal of the second polymer of the polymer composition leaving the polymer aligned with contact points of pairs of integrated circuit device components and after a replacement of the second polymer with a dielectric materials.

FIG. 16 shows the structure of FIG. 15 following a removal of PMMA polymer 880A in contact area 860 by, for example, a wet or dry chemical etch process. The removal of PMMA polymer 880 leaves PS polymers 875A and 875D connected to respective contact points of the component layer arrays (device array 820A and device array 820B). FIG. 16 also shows the structure following the introduction of a material in contact area 860 between PS polymers 875A and 875D. In one embodiment, material 885A is a dielectric material such as silicon dioxide or other suitable material that may be introduced by a low temperature process such as a low temperature chemical vapor deposition process or a spin-on like process or a gap-fill or other means. Dielectric layer 885A provides a mechanically stable layer that allows further processing to modify or replace PS polymers 875A and 875D.

Figure 17:
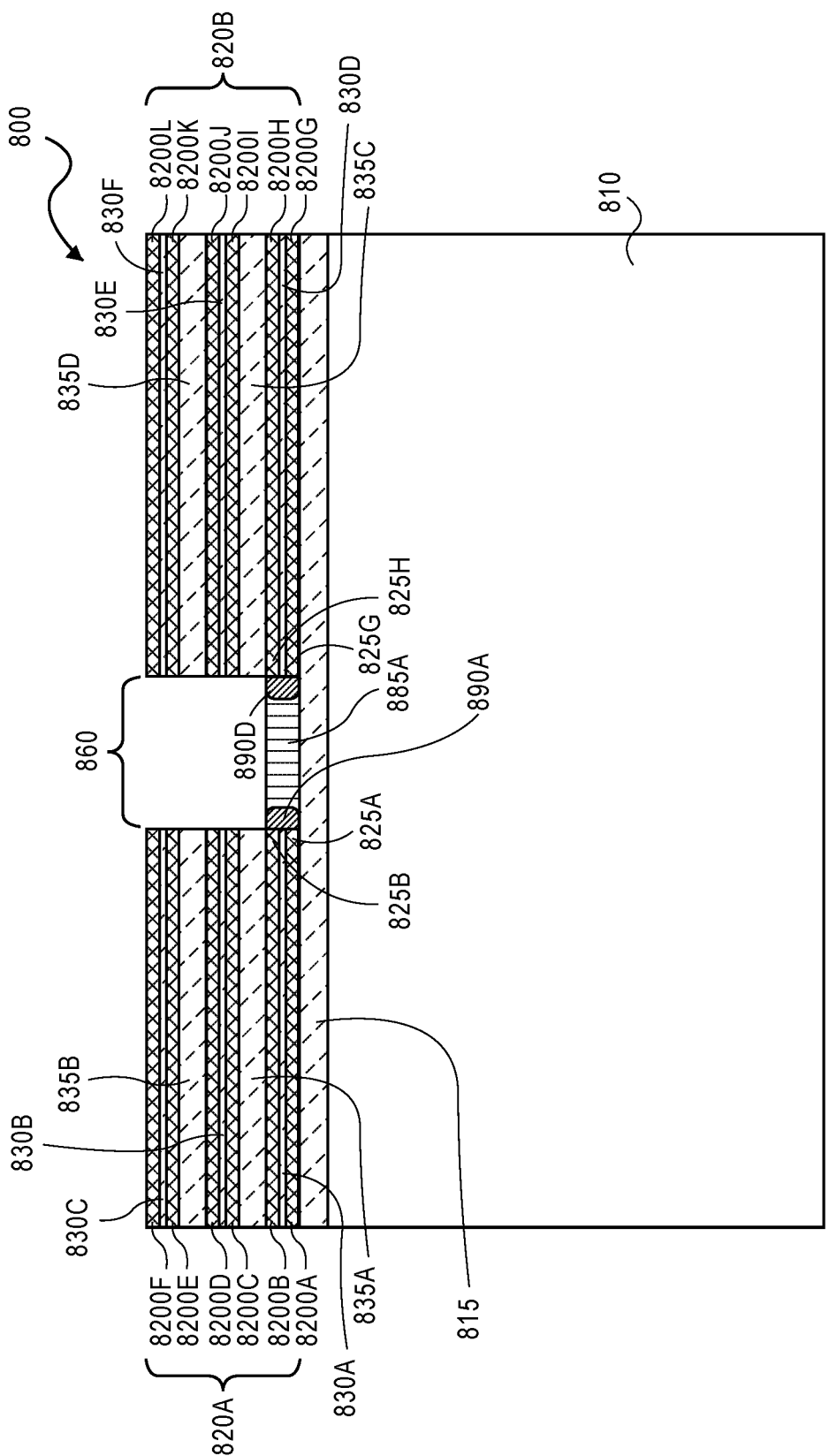
FIG. 17 shows the structure of FIG. 16 following a modification or replacement of the polymer aligned with contact points of pairs of integrated circuit components with conductive material.

FIG. 17 shows the structure of FIG. 16 following a modification or replacement of PS polymers 875A and 875D. In one embodiment, PS polymers 875A and 875D are removed by a wet or dry etch using chemistries such as noted above. Following a removal of the polymers, the region vacated is replaced with a conductive material such as a metal. This could be done by way of a vapor-phase CVD process. FIG. 17 shows conductive material 890A having replaced PS polymer 875A and conductive material 890D having replaced PS polymer 875D. In an alternative, PS polymer 875A and 875D can be modified to form a conductive material by introducing a conductive material into the polymer.

Figure 18:
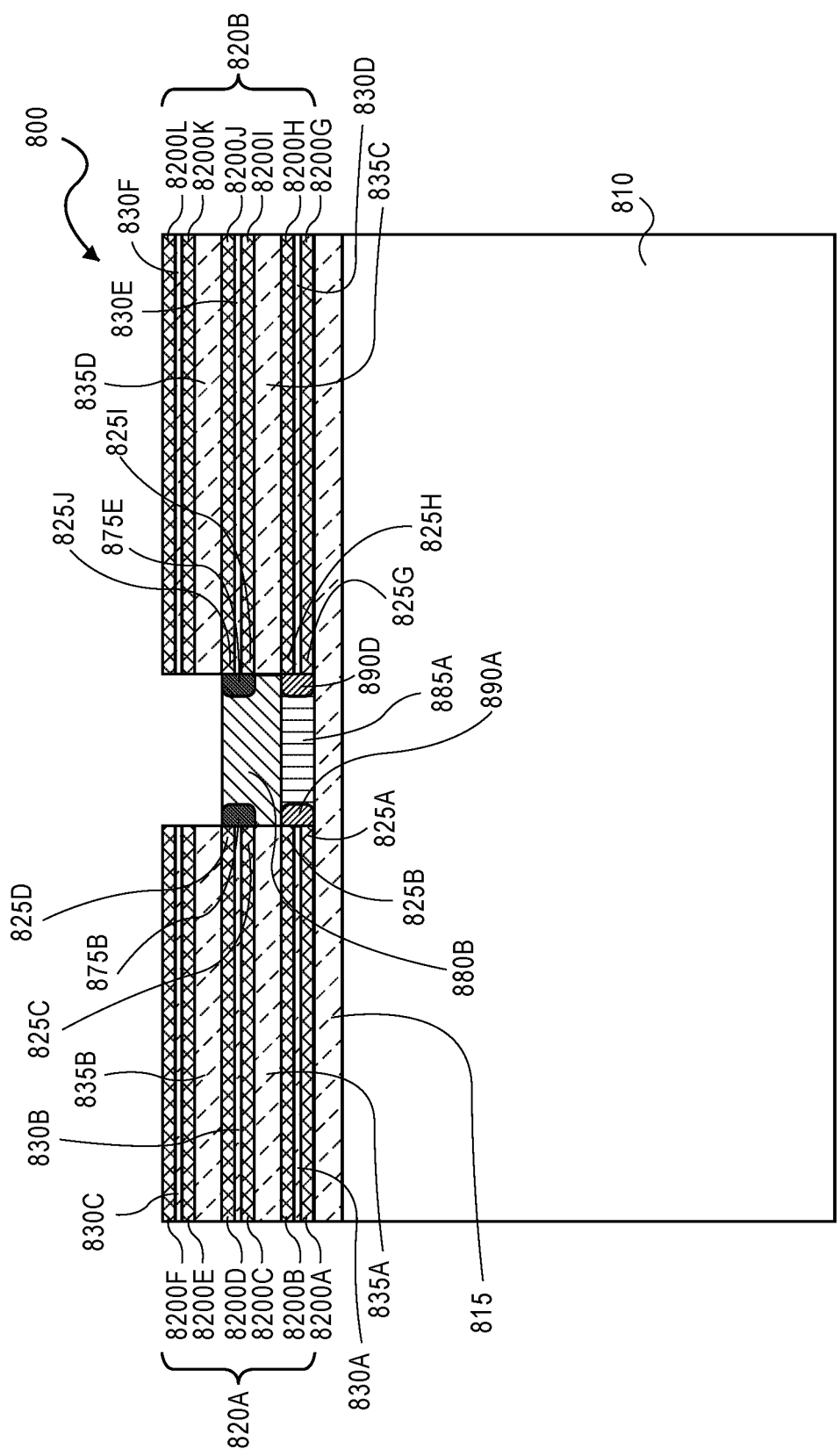
FIG. 18 shows the structure of FIG. 17 following a deposition of a polymer composition into the trench at a level including the next pairs of contact points of integrated circuit device components and the alignment of one of the polymers of the polymer composition with the contact points.

FIG. 18 shows the structure of FIG. 17 following the grafting of a contact brush on two more pairs of component layers of array 820A and array 820B, respectively, in trench 860 and the deposition of a PS-b-PMMA polymer into the trench. The selected pairs of component layers are component layers 8200A and 8200B of array 820A and 8200I and 8200J of array 820B which are the next lowest pairs with contact points exposed in the trench formed in contact area 860. FIG. 18 shows PS polymer 875B connected to contact point 825C of component layer 8200C and contact point 825D of component layer 8200D and PS polymer 875E connected to contact point 825I of component layer 8200I and contact point 825J of component layer 8200J with PMMA polymer 880B disposed between the PS polymers.

Figure 19:
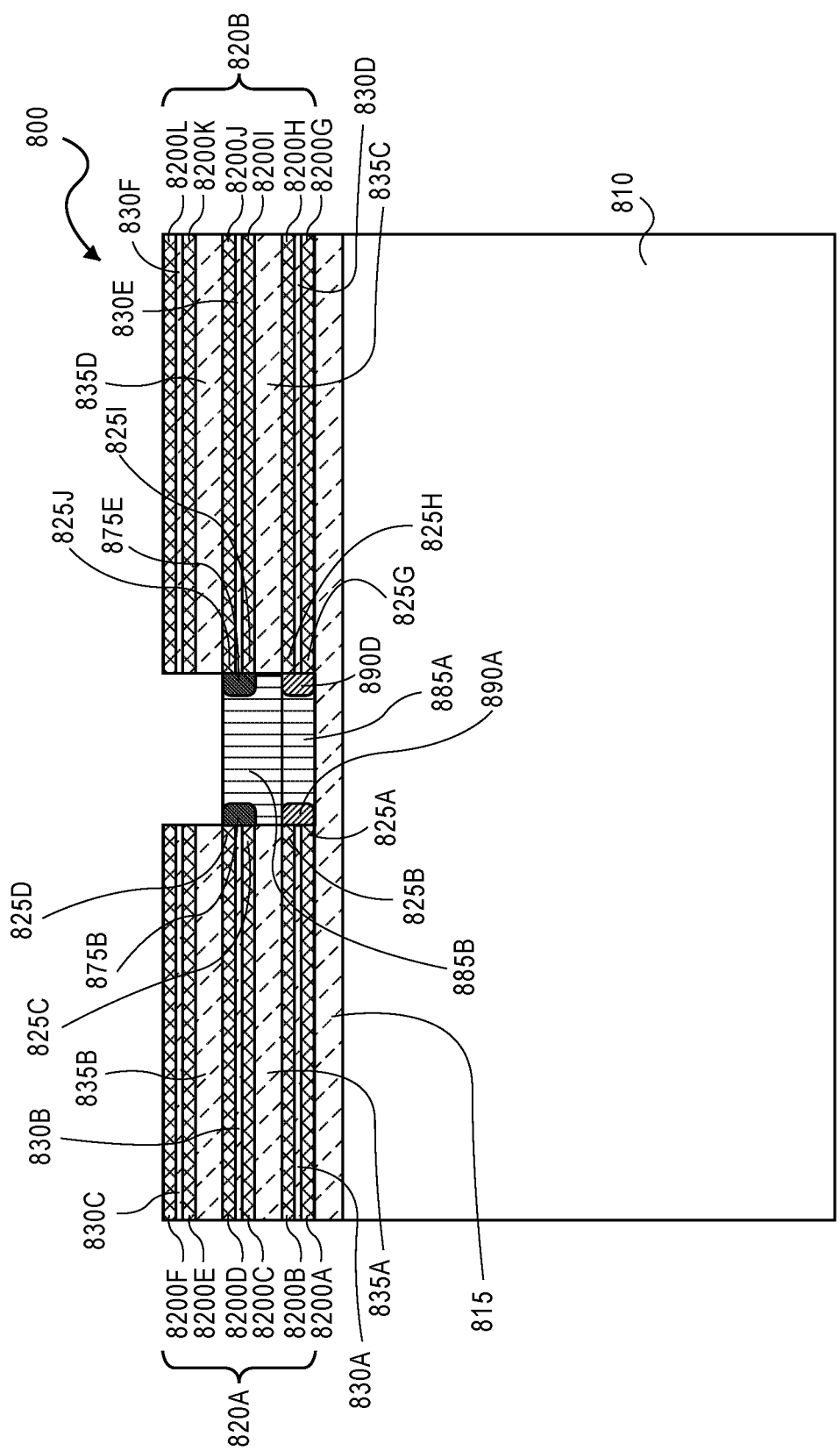
FIG. 19 shows the structure of FIG. 18 following a replacement of one of the polymers of the polymer composition with a dielectric material and the retention of the polymer aligned with the contact points.

FIG. 19 shows the structure of FIG. 18 following a removal of PMMA polymer 880B in contact area 860 by, for example, a wet or dry chemical etch process and its replacement with material 885B of, for example, a dielectric material similar to material 885A.

Figure 20:
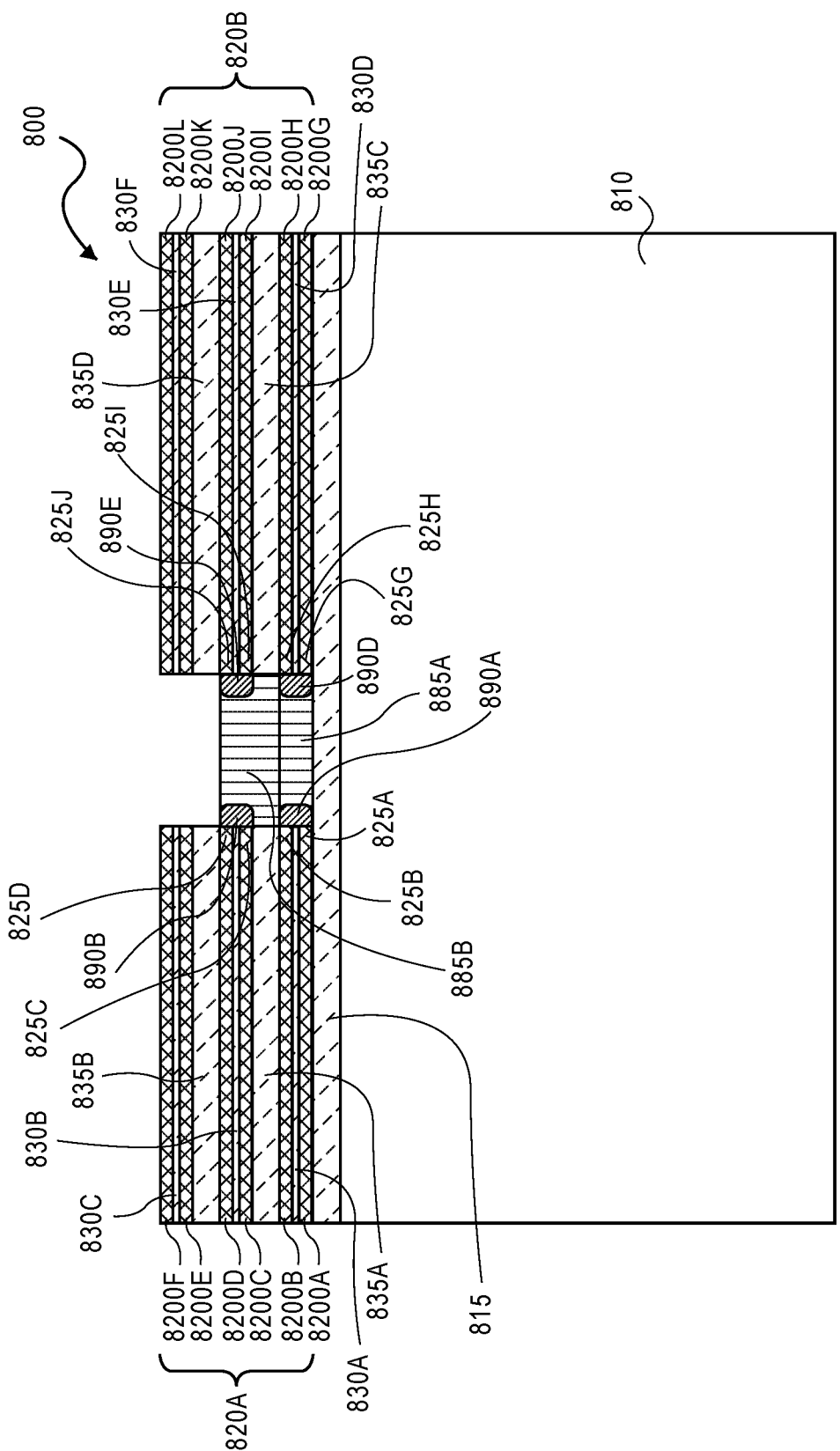
FIG. 20 shows the structure of FIG. 19 following a modification or replacement of the polymer aligned with the contact points with a conductive material.

FIG. 20 shows the structure of FIG. 19 following a modification or replacement of PS polymers 875B and 875E. In one embodiment, PS polymers 875B and 875E are removed by a wet etch using chemistries such as noted above and replaced with a conductive material such as a metal by a vapor-phase CVD process. FIG. 20 shows conductive material 890B having replaced PS polymer 875B and conductive material 890E having replaced PS polymer 875E.

Figure 21:
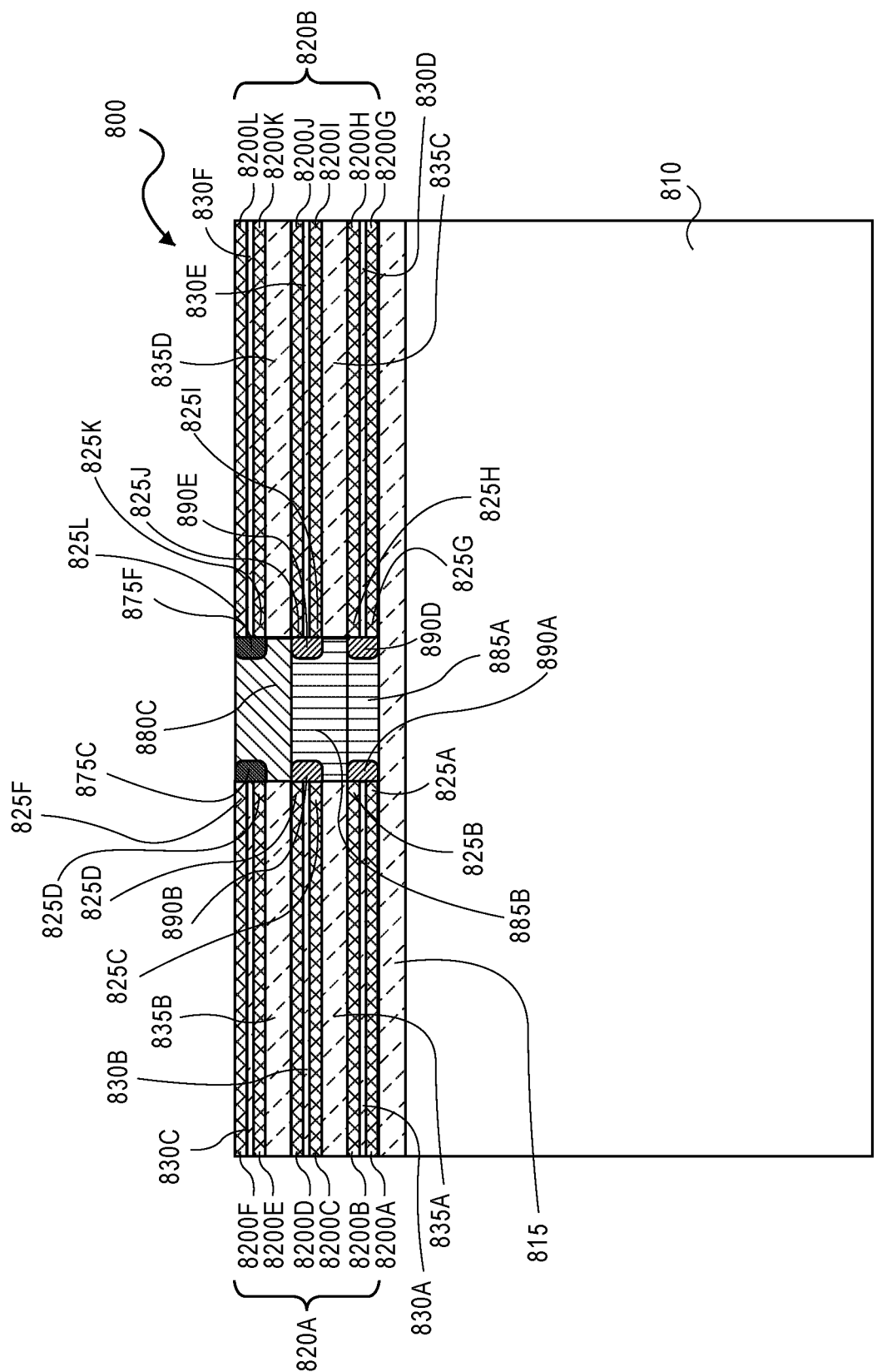
FIG. 21 shows the structure of FIG. 20 following a deposition of a polymer composition in the trench at a level including the next pairs of contact points of integrated circuit device components and alignment of one of the polymers with the contact points.

FIG. 21 shows the structure of FIG. 20 following the grafting of a contact brush on two more pairs of component layers of array 820A and array 820B, respectively, in trench 860 and the deposition of a PS-b-PMMA polymer into the trench. The selected pairs of component layers are component layers 8200E and 8200F of array 820A and 8200K and 8200L of array 820B which are the remaining pairs with contact points exposed in the trench formed in contact area 860. FIG. 21 shows PS polymer 875C connected to contact point 825E of component layer 8200E and contact point 825F of component layer 8200F and PS polymer 875F connected to contact point 825K of component layer 8200K and contact point 825L of component layer 8200L with PMMA polymer 880C disposed between the PS polymers.

Figure 22:
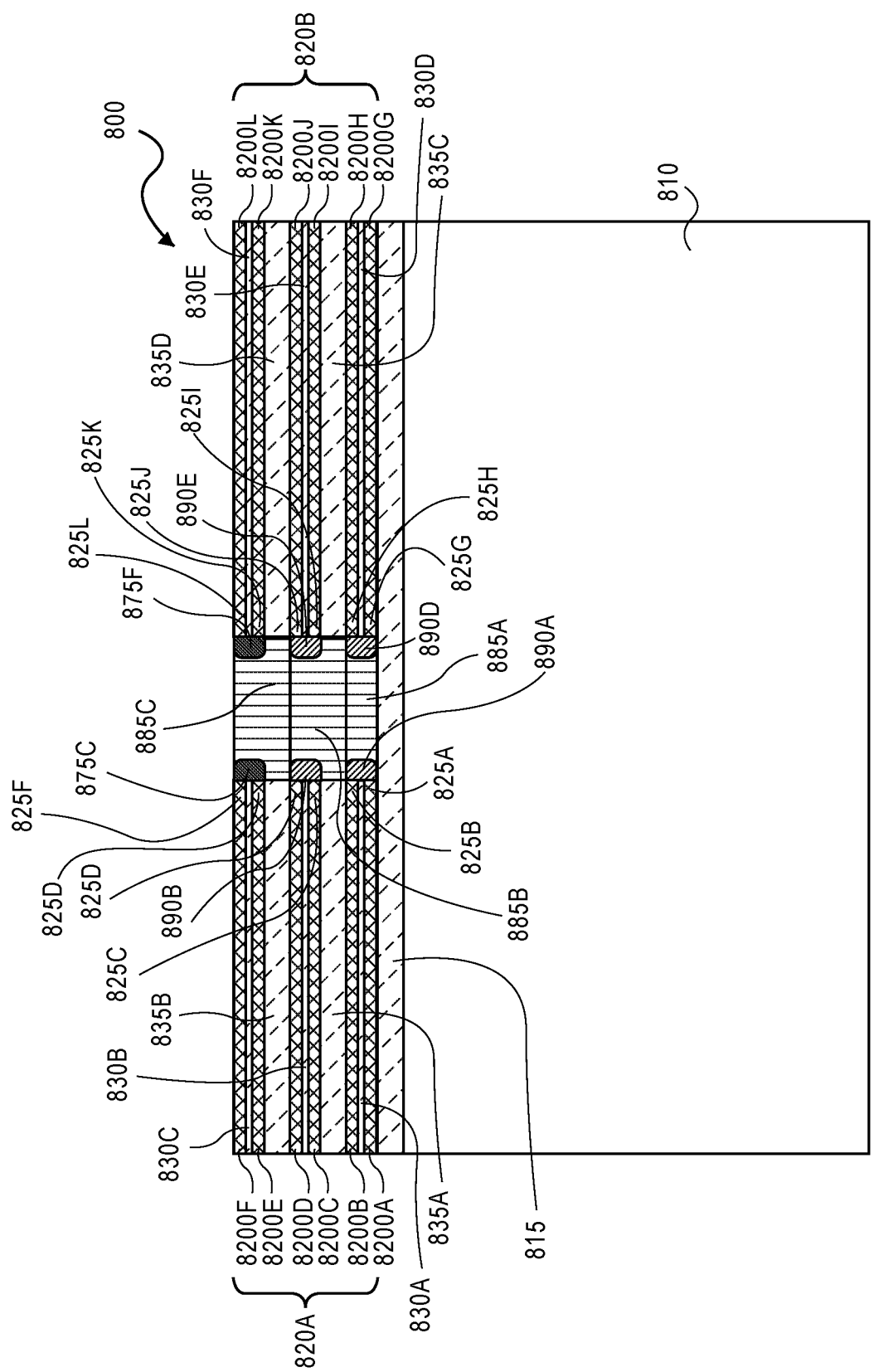
FIG. 22 shows the structure of FIG. 21 following a replacement of one of the polymers of the polymer composition with a dielectric material and the retention of the polymer aligned with the contact points.

FIG. 22 shows the structure of FIG. 21 following a removal of PMMA polymer 880C in contact area 860 by, for example, a wet or dry chemical etch process and its replacement with material 885C of, for example, a dielectric material similar to material 885A.

Figure 23:
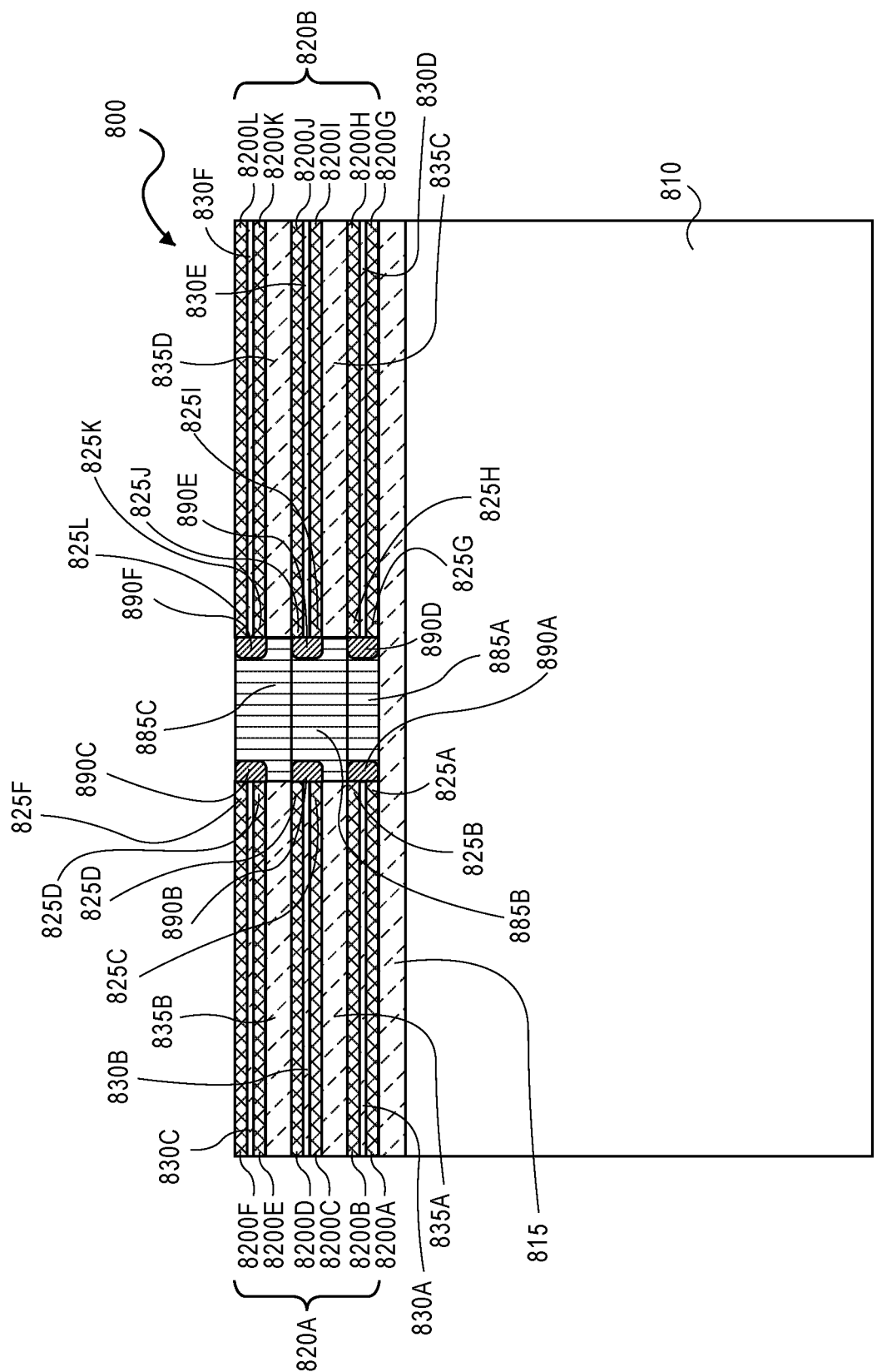
FIG. 23 shows the structure of FIG. 22 following a modification or replacement of the polymer aligned with the contact points with a conductive material.

FIG. 23 shows the structure of FIG. 22 following a modification or replacement of PS polymers 875C and 875F. In one embodiment, PS polymers 875C and 875F are removed by a wet etch using chemistries such as noted above and replaced with a conductive material such as a metal by a vapor-phase CVD process. FIG. 23 shows conductive material 890C having replaced PS polymer 875C and conductive material 890F having replaced PS polymer 875F.

Alternative embodiments to the use of a PS/PMMA polymer system would be to utilize different polymer systems. These systems and their processing would be analogous to the PS-b-PMMA system. Alternative polymer systems include, but are not limited to, poly(styrene)-b-poly(2-vinylpyridine) (PS-b-P2VP), poly(styrene)-b-poly(4-vinylpyridine) (PS-b-P4VP), poly(styrene)-b-poly(acrylic acid) (PS-b-PAA), poly(styrene)-b-poly(ethylene glycol) (PS-b-PEG), poly(styrene)-b-poly(imide) (PS-b-PI), and poly(styrene)-b-poly(dimethylsiloxane) (PS-b-PDMS).

Figure 24:
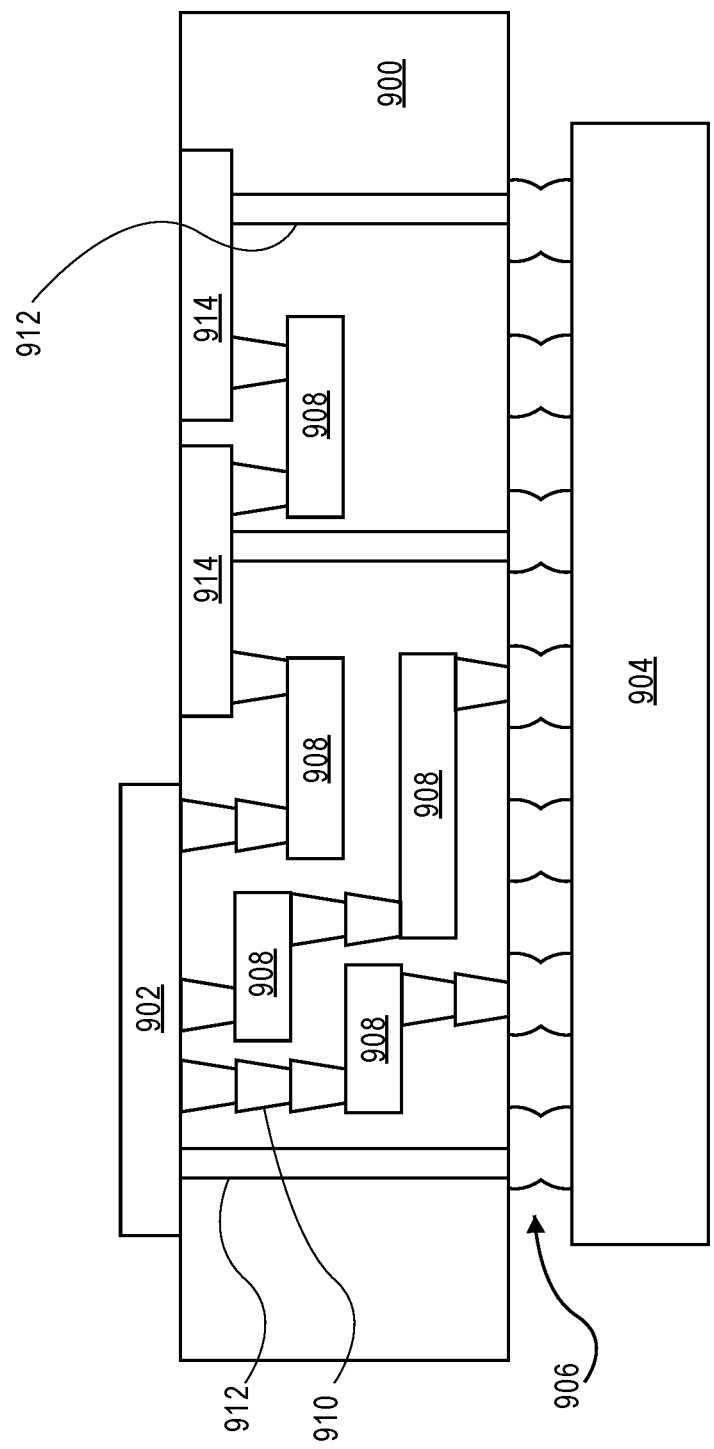
FIG. 24 is an interposer implementing one or more embodiments.

FIG. 24 illustrates interposer 900 that includes one or more embodiments. Interposer 900 is an intervening substrate used to bridge a first substrate 902 to second substrate 904. First substrate 902 may be, for instance, an integrated circuit die. Second substrate 904 may be, for instance, a memory module, a computer motherboard, or another integrated circuit die. Generally, the purpose of interposer 900 is to spread a connection to a wider pitch or to reroute a connection to a different connection. For example, interposer 900 may connect an integrated circuit die to ball grid array (BGA) 906 that can subsequently be connected to second substrate 904. In some embodiments, first and second substrates 902/904 are attached to opposing sides of interposer 900. In other embodiments, first and second substrates 902/904 are attached to the same side of interposer 900. In further embodiments, three or more substrates are interconnected by way of interposer 900.

Interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. Interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 900.

In accordance with embodiments, apparatuses or processes disclosed herein may be used in the fabrication of interposer 900.

Figure 25:
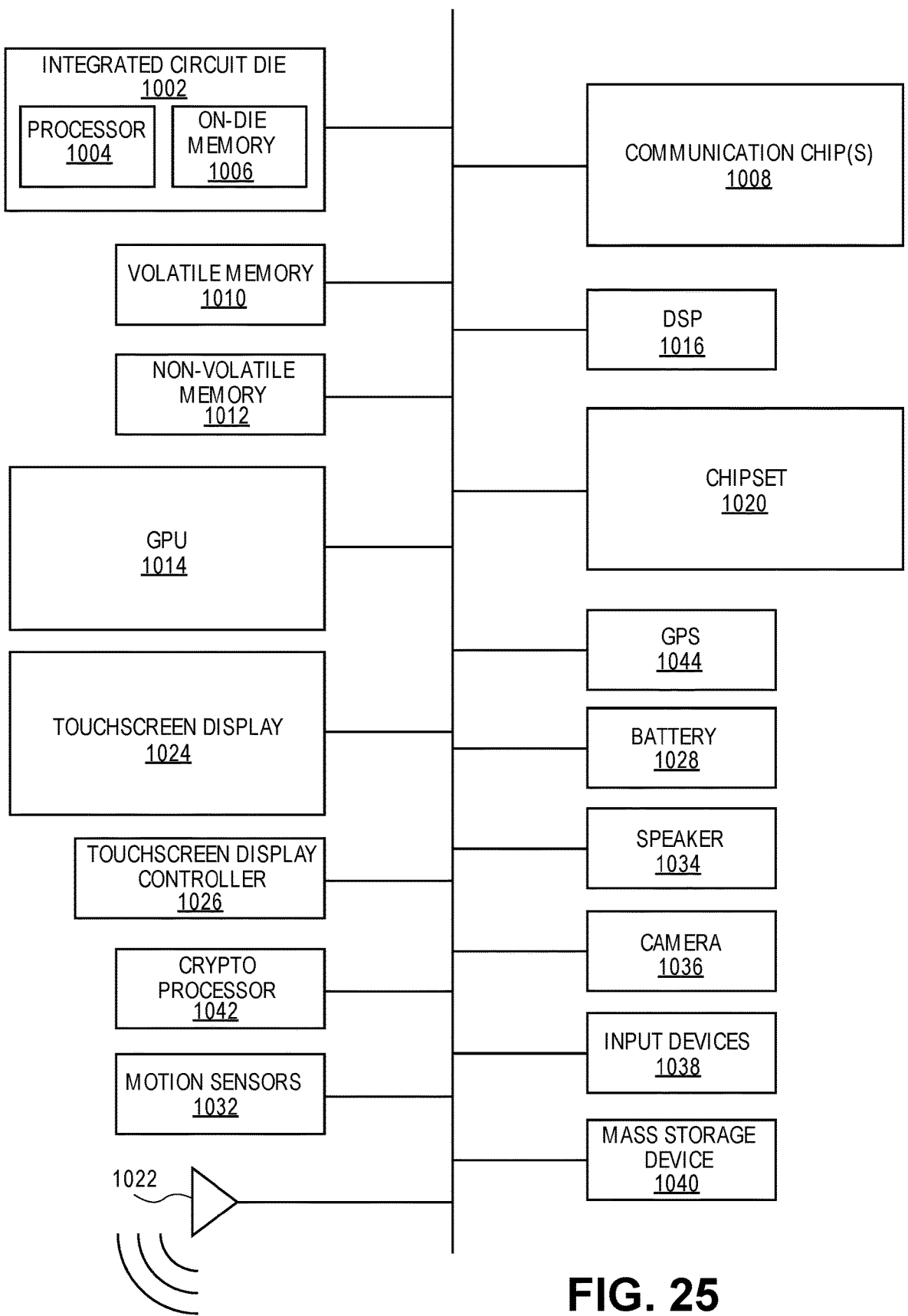
FIG. 25 illustrates an embodiment of a computing device.

FIG. 25 illustrates computing device 1000 in accordance with one embodiment. Computing device 1000 may include a number of components. In one embodiment, these components are attached to one or more motherboards. In an alternate embodiment, these components are fabricated onto a single system-on-a-chip (SoC) die rather than a motherboard. The components in computing device 1000 include, but are not limited to, integrated circuit die 1002 and at least one communication chip 1008. In some implementations communication chip 1008 is fabricated as part of integrated circuit die 1002. Integrated circuit die 1002 may include CPU 1004 as well as on-die memory 1006, often used as cache memory, that can be provided by technologies such as embedded DRAM (eDRAM) or spin-transfer torque memory (STTM or STTM-RAM).

Computing device 1000 may include other components that may or may not be physically and electrically coupled to the motherboard or fabricated within an SoC die. These other components include, but are not limited to, volatile memory 1010 (e.g., DRAM), non-volatile memory 1012 (e.g., ROM or flash memory), graphics processing unit 1014 (GPU), digital signal processor 1016, crypto processor 1042 (a specialized processor that executes cryptographic algorithms within hardware), chipset 1020, antenna 1022, display or a touchscreen display 1024, touchscreen controller 1026, battery 1028 or other power source, a power amplifier (not shown), global positioning system (GPS) device 1044, compass 1030, motion coprocessor or sensors 1032 (that may include an accelerometer, a gyroscope, and a compass), speaker 1034, camera 1036, user input devices 1038 (such as a keyboard, mouse, stylus, and touchpad), and mass storage device 1040 (such as hard disk drive, compact disk (CD), digital versatile disk (DVD), and so forth).

Communications chip 1008 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communication chips 1008. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 1004 of computing device 1000 includes one or more devices, such as transistors or metal interconnects, that are formed in accordance with embodiments presented above. The term "processor" may refer to any device or portion of a device that processes electronic data from registers and/or memory to transform that electronic data into other electronic data that may be stored in registers and/or memory.

Communication chip 1008 may also include one or more devices, such as transistors or metal interconnects, that are formed in accordance with embodiments presented above.

In further embodiments, another component housed within computing device 1000 may contain one or more devices, such as transistors or metal interconnects, that are formed in accordance with implementations presented above.

In various embodiments, computing device 1000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1000 may be any other electronic device that processes data.

EXAMPLES

Example 1 is an apparatus including an array of at least two vertically stacked layers of integrated circuit device components separated by a dielectric layer on a substrate, wherein each of the at least two vertically stacked layers includes a laterally disposed contact point; and an electrically conductive interconnection coupled to a lateral edge of the contact point of each of the at least two vertically stacked layers and bridging the dielectric layer.

In Example 2, the array of the apparatus of Example 1 includes at least a first pair and a second pair of two or more vertically stacked layers of integrated circuit device components and the electrically conductive interconnection includes a first electrically conductive interconnection coupled to the contact points of the first pair of two or more vertically stacked layers and a second electrically conductive interconnection coupled to the contact points of the second pair of two or more vertically stacked layers.

In Example 3, the integrated circuit device components of the apparatus of Example 1 include transistor devices.

In Example 4, the at least two vertically stacked layers of the apparatus of Example 3 include a layer of N-type transistor devices and a layer of P-type devices.

In Example 5, the integrated circuit device components of the apparatus of Example 1 include electrically conductive layers.

In Example 6, the electrically conductive connection of the apparatus of Example 1 includes a polymer including an electrically conductive material therein.

Example 7 is a method including forming an array of at least two vertically stacked layers of integrated circuit device components separated by a dielectric layer on a substrate, wherein each of the at least two vertically stacked layers includes a lateral contact point; forming a trench that exposes the lateral contact point of each of the at least two vertically stacked layers; depositing a polymer in the trench, wherein the polymer preferentially aligns to a material of the lateral contact point and bridges the dielectric layer; and modifying or replacing the polymer with an electrically conductive material.

In Example 8, the polymer of the method of Example 7 is a first polymer, the method further including depositing a second polymer in the trench wherein the second polymer aligns to a material of the dielectric layer.

In Example 9, prior to depositing a first polymer or a second polymer, the method of Example 8 includes modifying the lateral contact point of each of the at least two vertically stacked layers with a first brush and the dielectric layer with a second brush.

In Example 10, modifying or replacing the polymer with a conductive material of the method of Example 8 includes replacing the first polymer and prior to replacing the first polymer, the method includes replacing the second polymer with a dielectric material.

In Example 11, the integrated circuit device components of the method of Example 7 include transistor devices.

In Example 12, the integrated circuit device components of the method of Example 7 include electrically conductive layers.

In Example 13, modifying or replacing the polymer with a conductive material of the method of Example 7 includes modifying the polymer by driving an electrically conductive material into the polymer.

In Example 14, the array of the method of Example 7 includes at least two pairs of vertically stacked layers and forming a trench, depositing a polymer in the trench and modifying or replacing the polymer with an electrically conductive material is performed sequentially relative to the at least two pairs of vertically stacked layers.

In Example 15, the at least two pairs of vertically stacked layers of the method of Example 14 each include two or more vertically stacked layers of integrated circuit device components.

Example 16 is a method including forming an array of at least two vertically stacked layers of integrated circuit device components separated by a dielectric layer on a substrate, wherein each of the at least two vertically stacked layers includes a laterally disposed contact point disposed in a contact area; forming a trench through the contact area wherein the trench exposes the lateral contact point of each of the at least two vertically stacked layers; depositing a first polymer in the trench, wherein the polymer preferentially assembles on a material of the lateral contact point and bridges the dielectric layer; depositing a second polymer in the trench, wherein the second polymer preferentially assembles on a material of the dielectric layer; removing one of the first polymer and the second polymer from the trench; and modifying or replacing the polymer with an electrically conductive material.

In Example 17, modifying or replacing the polymer with a conductive material of the method of Example 16 includes replacing the first polymer and prior to replacing the first polymer, the method includes replacing the second polymer with a dielectric material.

In Example 18, the integrated circuit device components of the method of Example 16, include transistor devices.

In Example 19, the integrated circuit device components of the method of Example 16 include electrically conductive layers.

In Example 20, modifying or replacing the polymer with a conductive material of the method of Example 16 includes modifying the polymer by driving an electrically conductive material into the polymer.

In Example 21, the array includes at least two pairs of vertically stacked layers and forming a trench, depositing a polymer in the trench and modifying or replacing the polymer with an electrically conductive material of the method of Example 16 is performed sequentially relative to the at least two pairs of vertically stacked layers.

In Example 22, the at least two pairs of vertically stacked layers of the method of Example 21 each include two or more vertically stacked layers of integrated circuit device components.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
an array of at least two vertically stacked layers of integrated circuit device components separated by a dielectric layer on a substrate, wherein each of the at least two vertically stacked layers includes a laterally disposed contact point; and
an electrically conductive interconnection coupled to a lateral edge of the contact point of each of the at least two vertically stacked layers and bridging the dielectric layer, wherein the array includes at least a first pair and a second pair of two or more vertically stacked layers of integrated circuit device components separated by a first distance and the electrically conductive interconnection includes a first electrically conductive interconnection coupled to the contact points of the first pair of two or more vertically stacked layers and a second electrically conductive interconnection coupled to the contact points of the second pair of two or more vertically stacked layers, and wherein the first pair and the second pair are separated from one another by a second distance greater than the first distance.

2. The apparatus of claim 1, wherein the integrated circuit device components include transistor devices.

3. The apparatus of claim 2, wherein the at least two vertically stacked layers include a layer of N-type transistor devices and a layer of P-type devices.

4. The apparatus of claim 1, wherein the integrated circuit device components include electrically conductive layers.

5. The apparatus of claim 1, wherein the electrically conductive connection includes a polymer comprising an electrically conductive material therein.

6. A method comprising:
forming an array of at least two vertically stacked layers of integrated circuit device components separated by a dielectric layer on a substrate, wherein each of the at least two vertically stacked layers includes a lateral contact point;
forming a trench that exposes the lateral contact point of each of the at least two vertically stacked layers;
depositing a polymer in the trench, wherein the polymer preferentially aligns to a material of the lateral contact point and bridges the dielectric layer; and modifying or replacing the polymer with an electrically conductive material.

7. The method of claim 6, wherein the polymer is a first polymer, the method further comprising depositing a second polymer in the trench.

8. The method of claim 7, wherein prior to depositing a first polymer or a second polymer, the method includes modifying the lateral contact point of each of the at least two vertically stacked layers with a first brush and the dielectric layer with a second brush.

9. The method of claim 7, wherein modifying or replacing the polymer with a conductive material includes replacing the first polymer and prior to replacing the first polymer, the method includes replacing the second polymer with a dielectric material.

10. The method of claim 6, wherein the integrated circuit device components include transistor devices.

11. The method of claim 6, wherein the integrated circuit device components include electrically conductive layers.

12. The method of claim 6, wherein modifying or replacing the polymer with a conductive material includes modifying the polymer by driving an electrically conductive material into the polymer.

13. The method of claim 6, wherein the array includes at least two pairs of vertically stacked layers and forming the trench, depositing the polymer in the trench and modifying or replacing the polymer with an electrically conductive material is performed sequentially relative to the at least two pairs of vertically stacked layers.

14. The method of claim 13, wherein the at least two pairs of vertically stacked layers each include two or more vertically stacked layers of integrated circuit device components.

15. A method comprising:
forming an array of at least two vertically stacked layers of integrated circuit device components separated by a dielectric layer on a substrate, wherein each of the at least two vertically stacked layers includes a laterally disposed contact point disposed in a contact area;
forming a trench through the contact area wherein the trench exposes the lateral contact point of each of the at least two vertically stacked layers;
depositing a first polymer in the trench, wherein the polymer preferentially assembles on a material of the lateral contact points and bridges the dielectric layer;
depositing a second polymer in the trench;
removing the first polymer from the trench; and
replacing the removed first polymer with an electrically conductive material.

16. The method of claim 15, further comprising removing the second polymer and replacing the removed second polymer with a dielectric material.

17. The method of claim 15, wherein the integrated circuit device components include transistor devices.

18. The method of claim 15, wherein the integrated circuit device components include electrically conductive layers.

19. The method of claim 15, wherein the array includes at least two pairs of vertically stacked layers and forming the trench, depositing the polymer in the trench and replacing the polymer with an electrically conductive material is performed sequentially relative to the at least two pairs of vertically stacked layers.

20. The method of claim 19, wherein the at least two pairs of vertically stacked layers each include two or more vertically stacked layers of integrated circuit device components.

21. An apparatus comprising:
an array of at least two vertically stacked layers of integrated circuit device components separated by a dielectric layer on a substrate, wherein each of the at least two vertically stacked layers includes a laterally disposed contact point; and an electrically conductive interconnection coupled to a lateral edge of the contact point of each of the at least two vertically stacked layers and bridging the dielectric layer, wherein the electrically conductive connection includes a polymer comprising an electrically conductive material therein.

22. A method comprising:

forming an array of at least two vertically stacked layers of integrated circuit device components separated by a dielectric layer on a substrate, wherein each of the at least two vertically stacked layers includes a laterally disposed contact point disposed in a contact area;

forming a trench through the contact area wherein the trench exposes the lateral contact point of each of the at least two vertically stacked layers;

depositing a first polymer in the trench, wherein the polymer preferentially assembles on a material of the lateral contact points and bridges the dielectric layer;

depositing a second polymer in the trench; and modifying the first polymer to form an electrically conductive material.

23. The method of claim 22, wherein modifying the first polymer includes driving an electrically conductive material into the first polymer.

* * * * *